United States Patent
Wang et al.

(10) Patent No.: US 12,381,564 B2
(45) Date of Patent: Aug. 5, 2025

(54) PHASE NOISE REDUCTION BY CONTROLLING BIASING FOR ADJUSTABLE OSCILLATORS WITH CROSS-COUPLED TRANSISTORS

(71) Applicant: QUALCOMM Incorporated, San Diego, CA (US)

(72) Inventors: Kevin Jia-Nong Wang, Poway, CA (US); Luis Chen, Chula Vista, CA (US)

(73) Assignee: QUALCOMM Incorporated, San Diego, CA (US)

( * ) Notice: Subject to any disclaimer, the term of this patent is extended or adjusted under 35 U.S.C. 154(b) by 141 days.

(21) Appl. No.: 18/177,505

(22) Filed: Mar. 2, 2023

(65) Prior Publication Data
US 2024/0297653 A1 Sep. 5, 2024

(51) Int. Cl.
H03L 7/099 (2006.01)
H03B 5/12 (2006.01)
H03L 7/093 (2006.01)

(52) U.S. Cl.
CPC .............. *H03L 7/0991* (2013.01); *H03B 5/12* (2013.01); *H03L 7/093* (2013.01); *H03L 7/099* (2013.01); *H03L 2207/06* (2013.01)

(58) Field of Classification Search
CPC ... H03L 7/0991; H03L 7/093; H03L 2207/06; H03L 7/099; H03B 5/12
USPC ............................ 331/117 FE, 167, 175, 183
See application file for complete search history.

(56) References Cited

U.S. PATENT DOCUMENTS

| | | | | |
|---|---|---|---|---|
| 6,249,192 B1 * | 6/2001 | Gabara | ................ | H03B 5/1271 331/172 |
| 6,411,171 B2 * | 6/2002 | Itoh | ...................... | H03B 5/1243 331/177 V |
| 6,717,483 B2 * | 4/2004 | Nehoran | ................ | H03B 5/366 331/34 |
| 7,138,881 B2 * | 11/2006 | Lin | .......................... | H03B 5/06 331/116 R |

(Continued)

OTHER PUBLICATIONS

Soltanian B., et al., "AM-FM Conversion by the Active Devices in MOS LC-VCOs and its Effect on the Optimal Amplitude", IEEE Radio Frequency Integrated Circuits (RFIC) Symposium, Jun. 2006, 4 Pages, DOI: 10.1109/RFIC.2006.1651102.

(Continued)

*Primary Examiner* — Arnold M Kinkead
(74) *Attorney, Agent, or Firm* — Patterson + Sheridan, L.L.P.

(57) ABSTRACT

Certain aspects of the present disclosure provide methods and apparatus for minimizing, or at least reducing, a bias noise contribution to phase noise in an oscillator circuit. One example oscillator circuit generally includes an oscillator configured to generate an oscillating signal, an adjustable bias circuit coupled to a bias input of the oscillator and configured to provide a bias signal to the oscillator, and a control circuit having an input coupled to an output of the oscillator and having an output coupled to a control input of the adjustable bias circuit. The control circuit is configured to control the adjustable bias circuit to adjust the bias signal with a control signal, to determine an impact of the adjusted bias signal on a parameter of the oscillating signal, and to determine a setting for the control signal based on the impact on the parameter of the oscillating signal.

25 Claims, 15 Drawing Sheets

(56) References Cited

U.S. PATENT DOCUMENTS

| | | | |
|---|---|---|---|
| 7,466,838 B1 | 12/2008 | Moseley | |
| 9,793,906 B1* | 10/2017 | Midha | H03L 7/083 |
| 2001/0015681 A1* | 8/2001 | Hino | H03B 5/1231 |
| | | | 331/177 V |
| 2007/0222525 A1 | 9/2007 | Shimizu | |
| 2008/0284530 A1 | 11/2008 | Pellerano et al. | |
| 2009/0212876 A1 | 8/2009 | Kobayashi | |
| 2009/0261916 A1* | 10/2009 | Kelkar | H03B 5/1228 |
| | | | 327/551 |
| 2014/0266487 A1* | 9/2014 | Vaishnav | H03K 5/082 |
| | | | 331/183 |
| 2015/0256185 A1* | 9/2015 | Fujiwara | H03B 5/1215 |
| | | | 331/34 |

OTHER PUBLICATIONS

International Search Report and Written Opinion—PCT/US2024/016754—ISA/EPO—Jun. 28, 2024.

* cited by examiner

PHASE NOISE REDUCTION BY CONTROLLING BIASING FOR ADJUSTABLE OSCILLATORS WITH CROSS-COUPLED TRANSISTORS

TECHNICAL FIELD

Certain aspects of the present disclosure generally relate to electronic circuits and, more particularly, to controllable oscillator circuits.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

In order to transmit or receive data and/or control information, the radio frequency front-end of the base station and/or the mobile station may include one or more frequency synthesizers to generate oscillating signals used for upconverting baseband signals to frequencies for wireless transmission (referred to as radio frequency (RF) signals) and downconverting RF signals to baseband signals. At least one of the frequency synthesizers may include a voltage-controlled oscillator (VCO) or a digitally controlled oscillator (DCO) for tuning an oscillating signal to different frequencies. Such controllable oscillators may be implemented in a phase-locked loop (PLL) or a frequency-locked loop (FLL).

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide advantages that may include lower phase noise in oscillator circuits.

Certain aspects of the present disclosure generally relate to techniques and apparatus for minimizing, or at least reducing, phase noise by controlling biasing for adjustable oscillators with cross-coupled transistors.

Certain aspects of the present disclosure provide an oscillator circuit. The oscillator circuit generally includes an oscillator configured to generate an oscillating signal; an adjustable bias circuit coupled to a bias input of the oscillator and configured to provide a bias signal to the oscillator; and a control circuit including an input coupled to an output of the oscillator and including an output coupled to a control input of the adjustable bias circuit, the control circuit being configured to control the adjustable bias circuit to adjust the bias signal with a control signal, to determine an impact of the adjusted bias signal on a parameter of the oscillating signal, and to determine a setting for the control signal based on the impact on the parameter of the oscillating signal.

Certain aspects of the present disclosure provide an electronic device comprising the oscillator circuit described herein.

Certain aspects of the present disclosure are directed to a method of oscillation generation. The method generally includes generating an oscillating signal using an oscillator, controlling an adjustable bias circuit with a control signal to adjust a bias signal for the oscillator, determining an impact of the adjusted bias signal on a parameter of the oscillating signal, and determining a setting for the control signal based on the impact on the parameter of the oscillating signal.

Certain aspects of the present disclosure provide an apparatus. The apparatus generally includes means for generating an oscillating signal, means for providing an adjustable bias signal to bias the means for generating the oscillating signal, and means for controlling the means for providing the adjustable bias signal with a control signal. The means for controlling is configured to determine an impact of the adjusted bias signal on a parameter of the oscillating signal and to determine a setting for the control signal based on the impact on the parameter of the oscillating signal.

Certain aspects of the present disclosure are directed to a method of oscillation generation. The method generally includes generating an oscillating signal using an oscillator, biasing the oscillator with a plurality of different bias signals for the oscillator, determining a setpoint associated with one of the plurality of different bias signals corresponding to a maximum frequency of the oscillating signal during the biasing, and generating the oscillating signal using the oscillator biased according to the setpoint.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
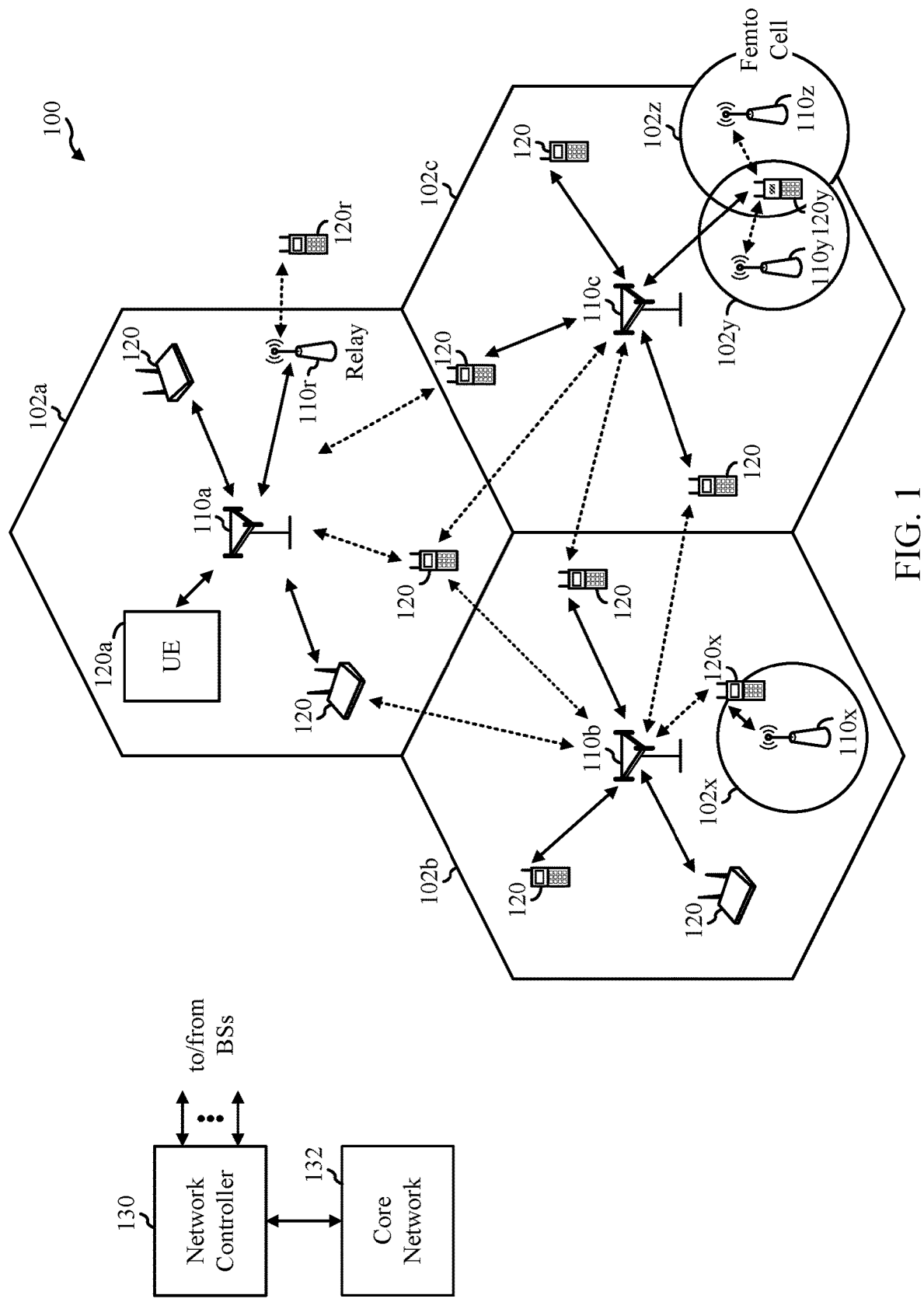
FIG. 1 is a diagram of an example wireless communications network, in which aspects of the present disclosure may be practiced.

Certain aspects of the present disclosure generally relate to techniques and apparatus for minimizing, or at least reducing the bias noise of a controllable oscillator, such as a voltage-controlled oscillator (VCO) or a digitally controlled oscillator (DCO). Such oscillators may be implemented by a resonant circuit (also known as an inductor-capacitor (LC) circuit, a tank circuit, or a tuned circuit) with one or more pairs of cross-coupled transistors. By reducing the contribution from bias noise, the overall phase noise of the oscillator may be reduced. Certain aspects of the present disclosure may utilize a loop that tracks a point of minimum sensitivity for bias noise to phase noise conversion. In some cases, a bias point for the oscillator may be set, and an impact of that bias point on the frequency of the oscillator may be detected. This approach may help determine a new setting for the bias point that drives the oscillator towards a maximum frequency (or at least a frequency near the maximum).

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS 110. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. A BS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number Nap of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include at least one oscillator circuit with a control circuit configured to control the bias setting for an adjustable bias circuit coupled to an oscillator in an effort to minimize, or at least reduce, the phase noise of the oscillator due to bias noise, as described in more detail herein.

Figure 2:
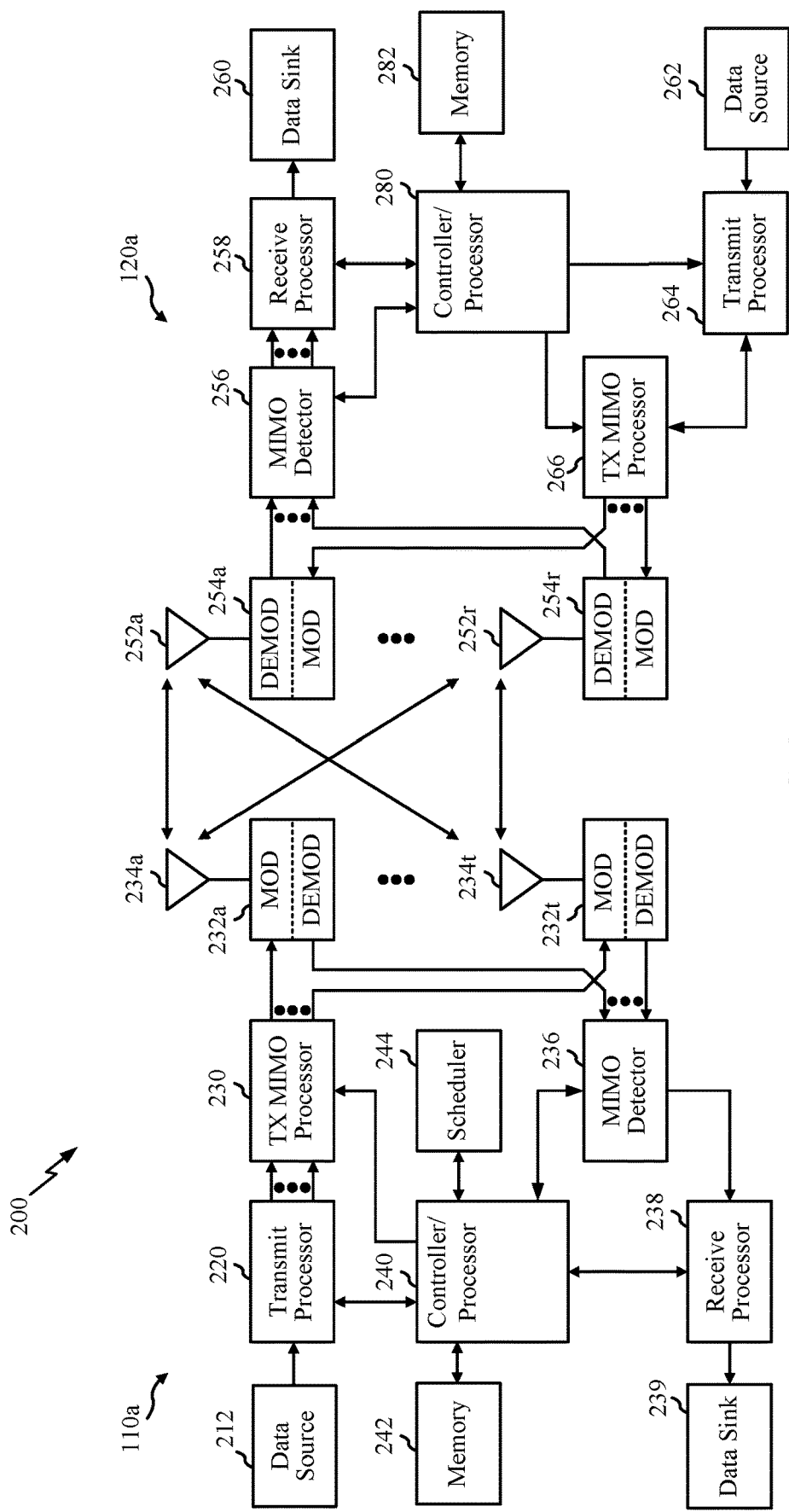
FIG. 2 is a block diagram conceptually illustrating a design of an example base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include at least one oscillator circuit with a control circuit configured to control the bias setting for an adjustable bias circuit coupled to an oscillator in an effort to minimize, or at least reduce, the phase noise of the oscillator due to bias noise, as described in more detail herein.

Example RF Transceiver

Figure 3:
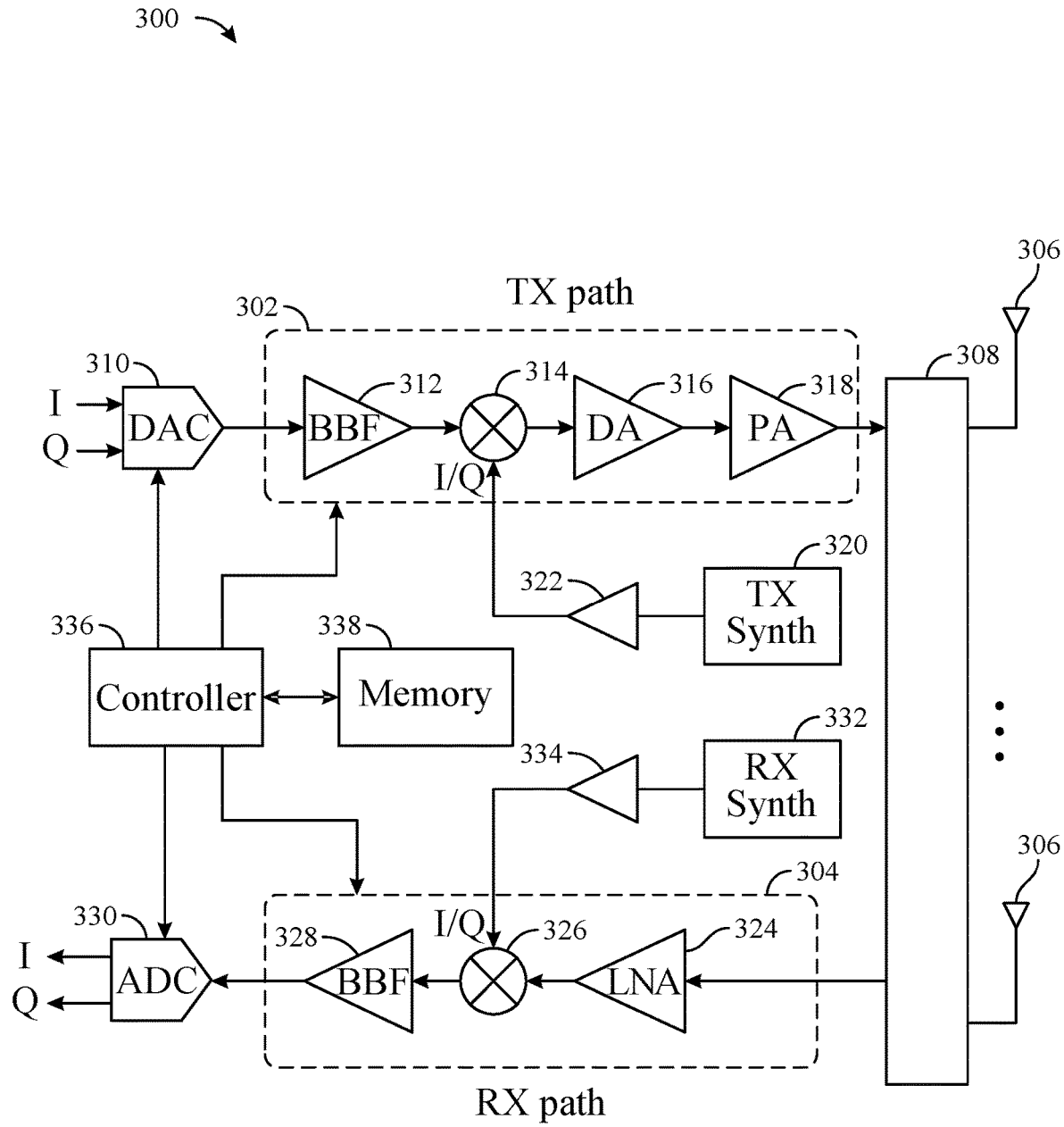
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320 with a transmit phase-locked loop (TxPLL). The transmit LO may be buffered or amplified by amplifier 322 before being mixed with the baseband signals in the mixer 314. Similarly, the receive LO may be produced by an RX frequency synthesizer 332 with a receive phase-locked loop (RxPLL). The receive LO may be buffered or amplified by amplifier 334 before being mixed with the RF signals in the mixer 326. In some cases, a single frequency synthesizer may be used for both the TX path 302 and the RX path 304. In some cases, the TX frequency synthesizer 320 and/or RX frequency synthesizer 332 may include a frequency multiplier, such as a frequency doubler, that is driven by an oscillator (e.g., a VCO) in the frequency synthesizer.

For certain aspects, the RxPLL and/or the TxPLL may include a VCO (or a DCO), an adjustable bias circuit coupled to the VCO (or DCO), and a control circuit configured to control the bias setting for the adjustable bias circuit in an effort to minimize, or at least reduce, the phase noise of the VCO (or DCO) due to bias noise, as described in more detail herein.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for oscillator circuits in any of various other suitable applications (e.g., clock generation and distribution in digital systems, high-speed serializer/deserializer (SerDes) systems, and the like).

Example Phase-Locked Loop

Figure 4:
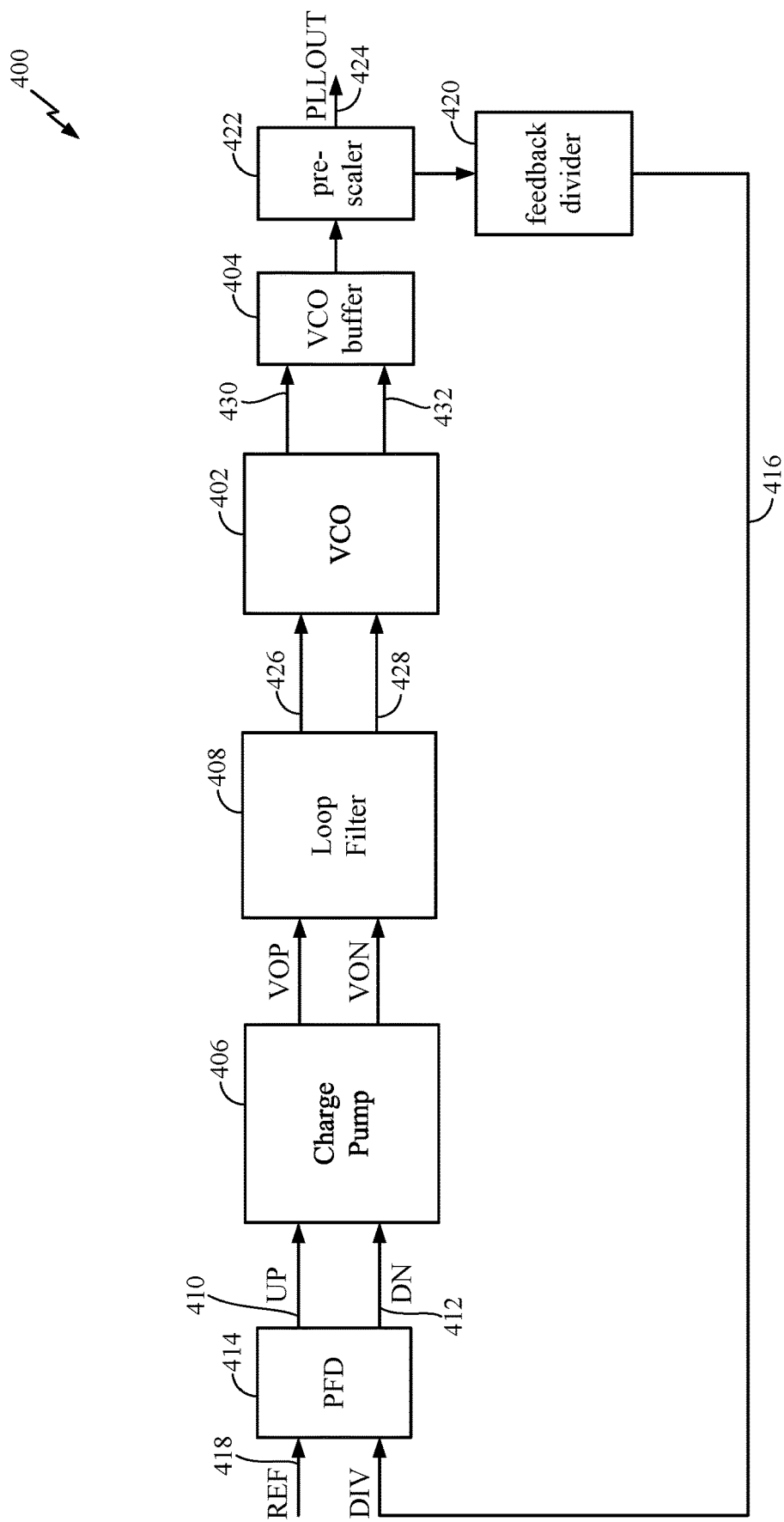
FIG. 4 is a block diagram of an example phase-locked loop (PLL).

FIG. 4 is a block diagram of an example phase-locked loop (PLL) 400, in which aspects of the present disclosure may be practiced. The PLL 400 may be utilized in a frequency synthesizer, such as a transmit phase-locked loop (TxPLL) in the TX frequency synthesizer 320 or a receive phase-locked loop (RxPLL) in the RX frequency synthesizer 332 of FIG. 3.

As illustrated in FIG. 4, a charge pump 406 coupled to a low-pass loop filter 408 (also referred to as a "charge pump filter" or "PLL loop filter") may provide a control voltage (also referred to as a "tuning voltage" or "Vtune") to a voltage-controlled oscillator (VCO) 402, where the control voltage is used to adjust an oscillation frequency of the VCO 402. The charge pump 406 and the VCO 402 may receive power via two power supply rails: a positive supply rail and a negative supply rail. Switches in the charge pump 406 may be controlled by up/down pulse signals 410, 412 (labeled "UP" and "DN"), and the loop filter 408 may reject the high frequency transient signals from this switching activity. These up/down pulse signals 410, 412 may be generated by a phase-frequency detector (PFD) 414, which may compare a feedback signal 416 (based on an output or processed output of the VCO 402 and labeled "DIV") to a reference frequency signal 418 (labeled "REF"). In an aspect, as illustrated in FIG. 4, the feedback signal 416 may be generated by buffering the output of the VCO 402 with a VCO buffer 404, scaling the buffered signal in a pre-scaler 422 to generate the PLL's output signal 424 (labeled "PLL-OUT"), and dividing an output of the pre-scaler 422 in a feedback frequency divider 420.

In some aspects of the present disclosure, as illustrated in FIG. 4, the input control voltage for the VCO 402 may be provided by the charge pump 406 and the low-pass loop filter 408 via VCO control inputs 426, 428. A resonant tank circuit of the VCO 402 may generate, at differential VCO outputs 430, 432, a periodic signal having a specific frequency (e.g., determined by a voltage at the VCO control inputs 426, 428), which may be input to the VCO buffer 404. The VCO buffer 404 may be coupled to the differential VCO outputs 430, 432 in an effort to isolate the VCO 402 from the load in the PLL 400 and other circuits receiving the PLL's output signal 424. The VCO buffer 404 may be also employed in an effort to amplify the signal swing and correct any duty cycle distortions of the differential VCO outputs 430, 432.

Although the PLL 400 is implemented as a differential circuit in FIG. 4, it is to be understood that the PLL may alternatively be implemented as a single-ended circuit.

Example Controllable Oscillator and Biasing

Figure 5A:
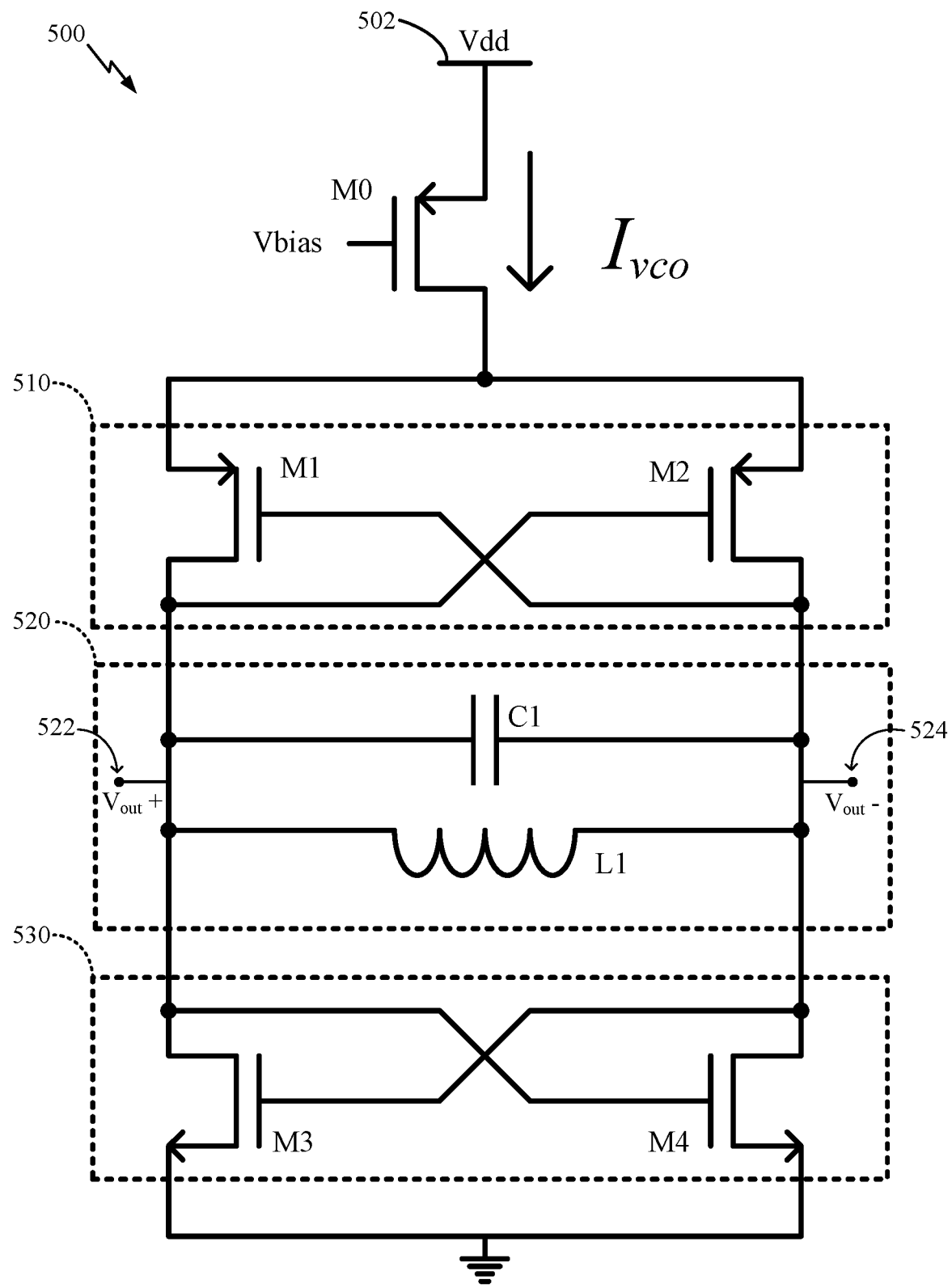
FIG. 5A is a circuit diagram of an example voltage-controlled oscillator (VCO) with an adjustable current source for biasing the VCO.

FIG. 5A is a circuit diagram of an example voltage-controlled oscillator (VCO) 500 and an adjustable current source (implemented by transistor M0) for biasing the VCO. The VCO 500 may be one example implementation of the VCO 402 shown in FIG. 4 and may be controlled in accordance with aspects of the present disclosure.

The VCO 500 may receive power from a power supply rail 502 with a power supply voltage (e.g., Vdd) referenced to a reference potential node (e.g., electrical ground). The VCO 500 may have differential output nodes 522 (labeled "$V_{out+}$" for the positive output) and 524 (labeled "$V_{out-}$" for the negative output) for outputting the oscillating signal generated when power is supplied to the VCO.

As illustrated, the VCO 500 includes a resonant circuit 520 (also referred to as an inductor-capacitor (LC) circuit, a tank circuit, or a tuned circuit). Due to this LC circuit, the VCO 500 may also be referred to as an "LC oscillator." The VCO 500 also includes a pair of cross-coupled p-type transistors M1 and M2 that form a p-type active negative transconductance ($-g_m$) circuit 510. Additionally, the VCO 500 includes a pair of cross-coupled n-type transistors M3 and M4 that form an n-type active negative transconductance circuit 530. The cross-coupled transistors serve to cancel out the loss (due to parasitics) of the resonant circuit and, thus, to sustain the oscillating mechanism of the VCO 500.

The resonant circuit 520 may include an inductive element or inductor network (either represented by inductor L1) and a capacitor network (represented by capacitor C1) designed to oscillate in a certain resonant frequency range. The inductor L1 may also be referred to as a "main LC tank inductor." The inductor L1 and/or one or more capacitors (or varactors) in the capacitor network may be variable to adjust the VCO frequency within a tuning range. Although not shown, the resonant circuit may include one or more switches used to select different combinations of capacitors in the capacitor network.

In FIG. 5A, the adjustable current source is implemented by p-type transistor M0, which has a source coupled to the power supply rail 502, a drain coupled to the sources of cross-coupled p-type transistors M1 and M2, and a gate coupled to a control signal node for receiving a control signal labeled "Vbias." In this manner, the control signal Vbias may be used to adjust the source-to-drain current of transistor M0, which is the bias current labeled "$I_{VCO}$" for the VCO 500. As an alternative, the adjustable current source may be a tail current sink using an n-type transistor coupled between the reference potential node and the sources of the cross-coupled n-type transistors M3 and M4.

Figure 5B:
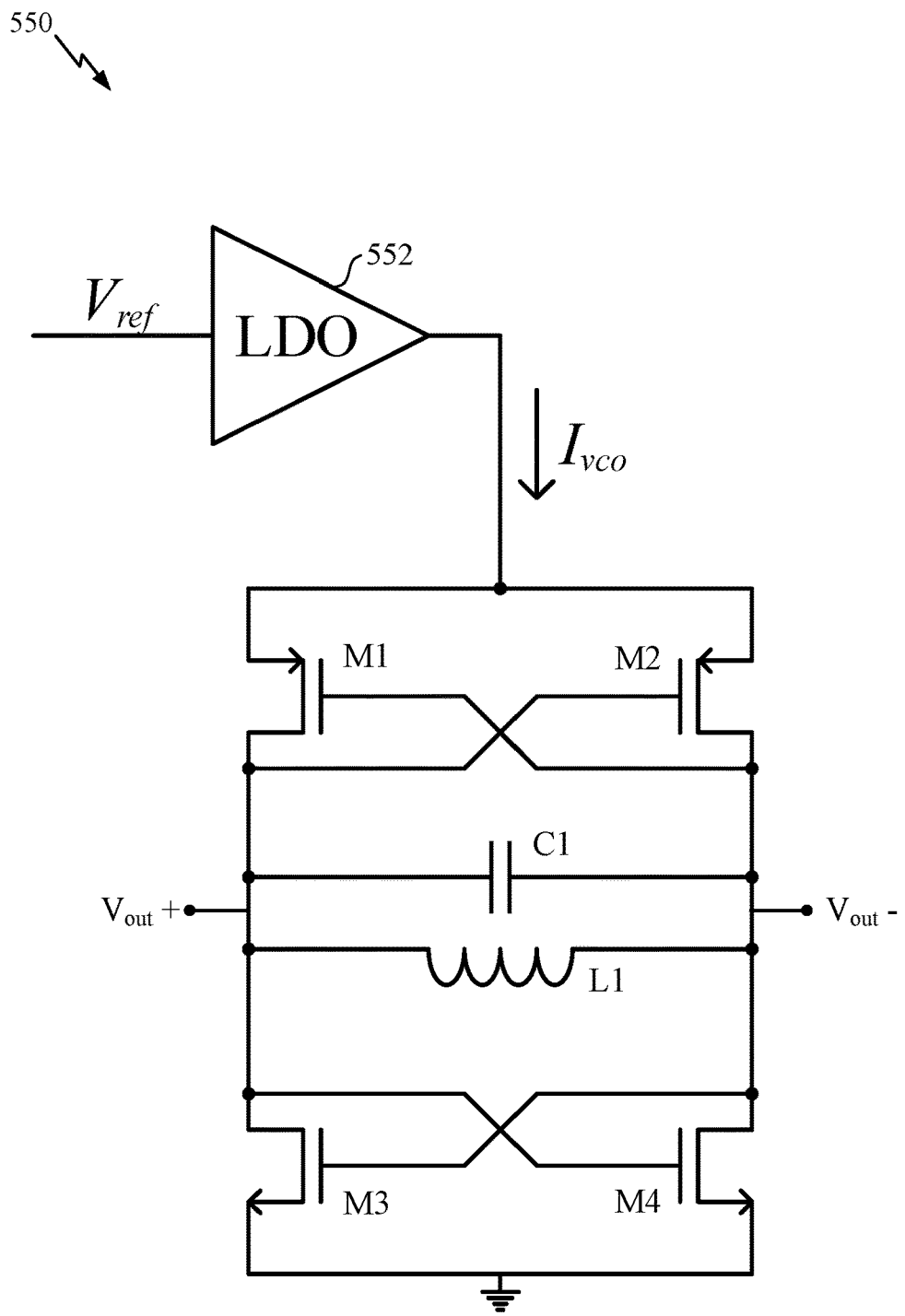
FIG. 5B is a circuit diagram of an example VCO with an adjustable reference voltage for biasing the VCO.

FIG. 5B is a circuit diagram of another example VCO 550 that may be controlled in accordance with aspects of the present disclosure. As illustrated, the VCO 550 may utilize an adjustable reference voltage (Vref) and a voltage regulator 552 (e.g., a low-dropout (LDO) regulator) for providing the VCO current to bias the VCO. The other components of the VCO 550 are described above with respect to the VCO 500.

Example Phase Noise Notch

Various oscillators, including the LC oscillators shown in FIGS. 5A and 5B, may generate undesirable phase noise. As described above, LC oscillators typically include an n-type and/or a p-type cross-coupled pair of transistors and may be biased using any of various suitable techniques, such as a tail current source (or sink) or LDO biasing. Phase noise in an oscillator consists of noise from the cross-coupled transistors and noise from biasing.

Phase noise has many undesirable characteristics that may include increasing period jitter (time deviations from an average or ideal signal period; also referred to as "cycle jitter"). Increased period jitter may adversely impact digital clocking performance. In wireless communications, oscillator phase noise may also impact transmitter noise limits.

The phase noise of the oscillator may be lowered by using higher power or a higher voltage swing in the oscillator. However, using higher power to reduce noise reduces battery life, which is typically undesirable in portable and other battery-operated devices. Further, higher voltage swings may not be possible in certain advanced technologies (e.g., due to power supply limitations, or the potential for increased device breakdowns).

Figure 6A:
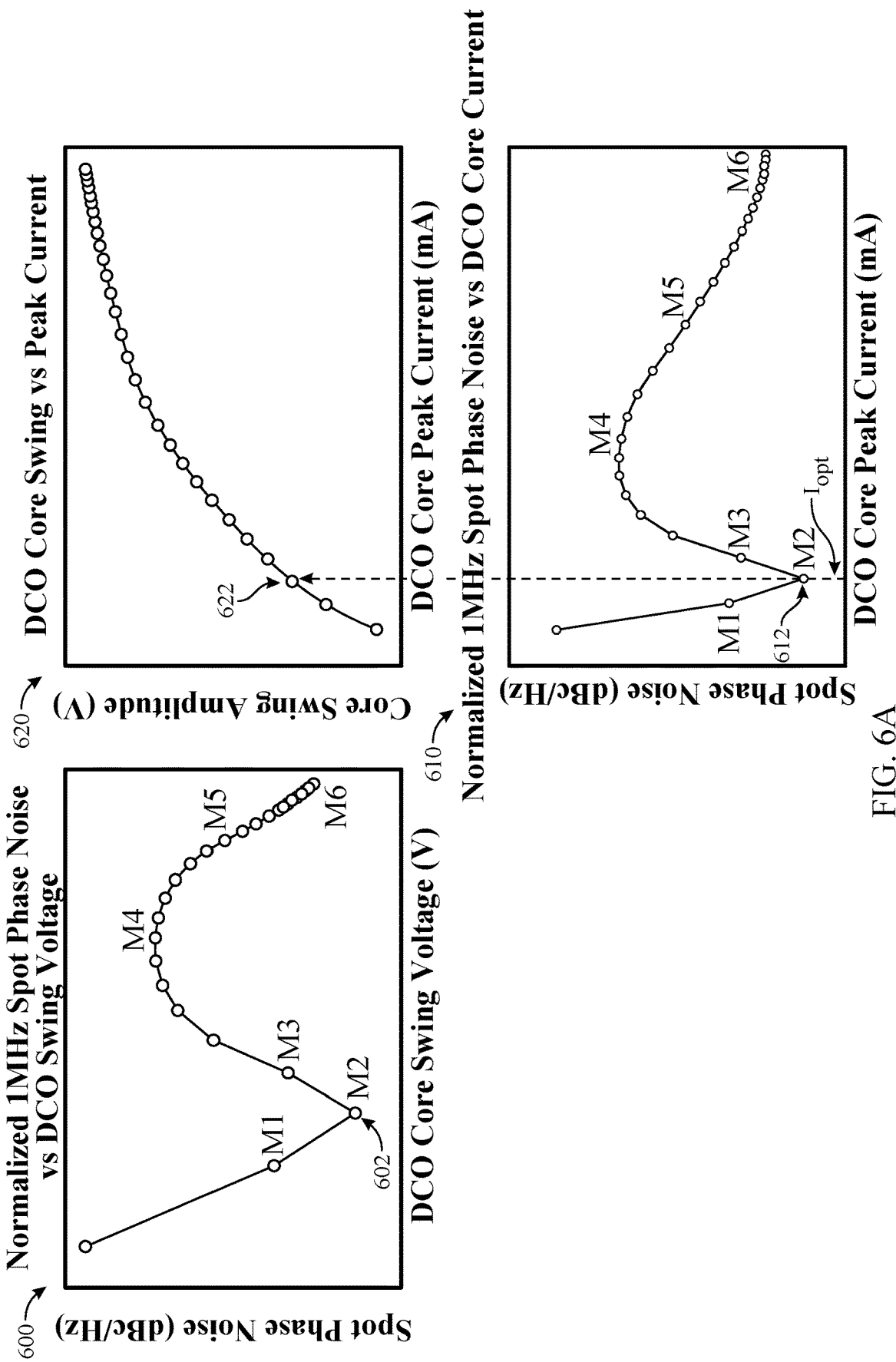
FIG. 6A depicts example graphs of oscillator phase noise versus output swing and bias current and a corresponding graph of output swing versus bias current.

FIG. 6A includes an example graph 600 of oscillator phase noise (labeled "Spot Phase Noise") in decibels relative to the carrier per hertz (dBc/Hz) versus output voltage amplitude (labeled "DCO Core Swing Voltage") in volts for a controllable oscillator (e.g., a DCO). The output voltage amplitude is the voltage swing between $V_{out+}$ and $V_{out-}$, as illustrated in the VCOs 500, 550, for example. In the illustrated example graphs of phase noise, the phase noise values may be assumed to be normalized to a 1 GHz oscillator with an offset of 1 MHz. The graph 600 includes measurements of phase noise at different output voltage amplitudes, where certain measurements M1-M6 are used for comparison purposes between the different graphs of FIGS. 6A and 6B. As illustrated in the graph 600, there is a point 602 (coinciding with measurement M2) where the phase noise plot exhibits a notch and drops to a minimum value (or at least a near-minimum value). That is, as the oscillation amplitude is swept, a notch in the phase noise can be found.

FIG. 6A also includes an example graph 610 of oscillator phase noise in dBc/Hz versus bias current $I_{VCO}$ (labeled "DCO Core Peak Current") in milliamperes (mA) for the same oscillator as in graph 600. The phase noise plot in the graph 610 also exhibits a notch and drops to a minimum value (or at least a near-minimum value) at point 612, which has a bias current value that may be designated as the optimum bias current ($I_{opt}$) (and which corresponds to measurement M2).

The output swing of an LC oscillator is controlled based on the bias current. This is depicted by example graph 620 of the output swing versus the bias current, which illustrates the monotonic relationship between the output voltage amplitude and the bias current. In other words, as the bias current increases, the output voltage amplitude gets larger. By aligning the bias current axes of graphs 610 and 620, an output voltage amplitude value, at point 622, may be identified that corresponds to $I_{VCO}=I_{opt}$, at point 612, and results in the minimum (or at least near-minimum) phase noise.

Figure 6B:
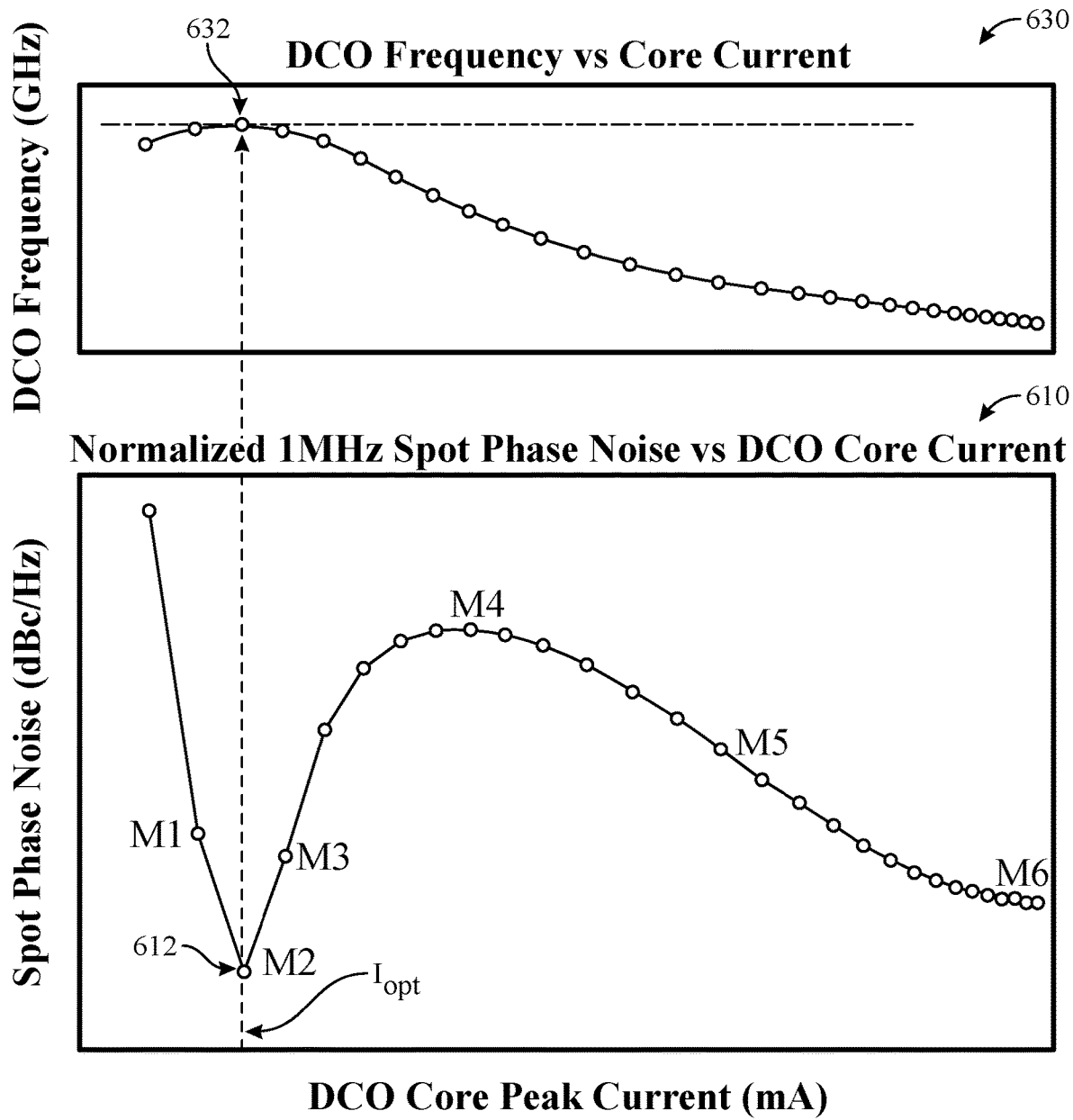
FIG. 6B depicts an example graph of oscillator frequency versus peak current aligned with an example graph of oscillator phase noise versus peak current.

FIG. 6B includes an example graph 630 of oscillator frequency (labeled "DCO Frequency") in GHz versus bias current in mA for the same oscillator used to generate the graph 610. By aligning the bias current axes of graphs 610 and 630, a peak in oscillator frequency, at point 632, corresponds to the notch in phase noise at point 612 (where $I_{VCO}=I_{opt}$), as shown by the dashed line in FIG. 6B. At $I_{opt}$, the derivative of the oscillator frequency curve is zero (or at least near zero), and the gain from the bias current $I_{VCO}$ to the output phase is zero. This generally means that when $I_{VCO}$ is set to $I_{opt}$, small variations in $I_{VCO}$ do not translate into changes in oscillator frequency. Small variations in $I_{VCO}$ may be a result of or considered noise. Thus, the impact of the noise in the bias current (often referred to as the "bias noise") on output phase noise is eliminated, or at least substantially reduced, regardless of the frequency of the bias noise. That is, at $I_{VCO}=I_{opt}$ (or equivalently at peak oscillator frequency for a bias current sweep), the bias noise contribution to oscillator phase noise is nulled (or at least reduced).

Example Oscillator Circuits with Bias Control for Phase Noise Reduction

Therefore, certain aspects of the present disclosure may determine and operate with a bias control setting for an adjustable bias circuit that effectively sets $I_{VCO}$ to $I_{opt}$, in an effort to achieve a minimum value of oscillator phase noise (due to bias noise). For certain aspects, this may be achieved with a loop that tracks the minimum sensitivity point for bias noise to phase noise conversion (e.g., point 612 or point 632, corresponding to $I_{opt}$). This loop may operate during a calibration mode and/or as a background calibration while in mission mode for a device.

Figure 7:
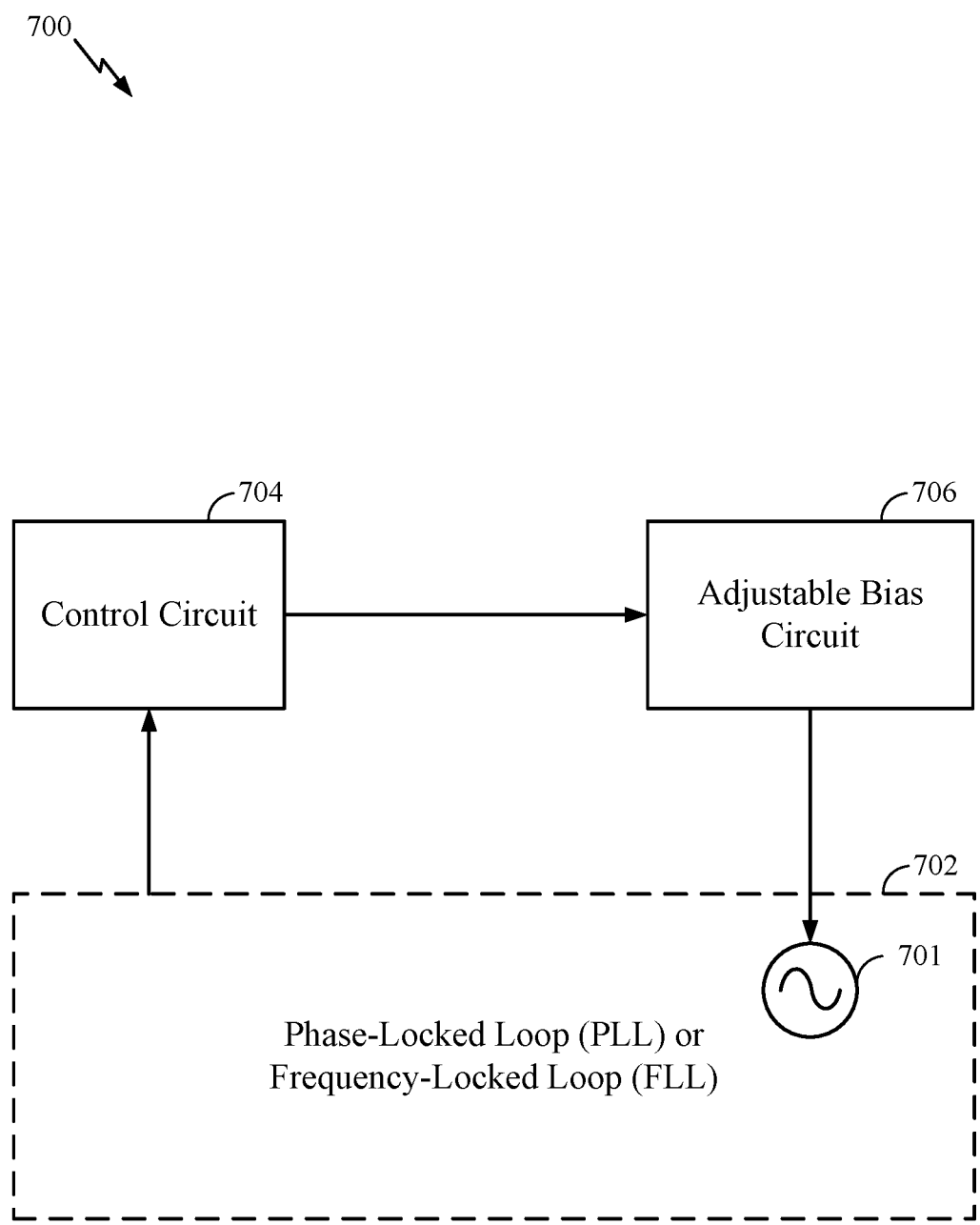
FIG. 7 is a block diagram of an example oscillator circuit with a controllable oscillator and a control circuit configured to control the bias setting for an adjustable bias circuit coupled to the oscillator, in accordance with certain aspects of the present disclosure.

FIG. 7 is a block diagram of an example oscillator circuit 700 with an oscillator 701, a control circuit 704, and an adjustable bias circuit 706, in accordance with certain aspects of the present disclosure. The oscillator 701 may be an LC oscillator, such as represented by the resonant circuit 520 and one or more pairs of cross-coupled transistors in the VCO 500 of FIG. 5A. The control circuit 704 has an output coupled to a control input of the adjustable bias circuit 706 and is configured to control the bias setting (e.g., Vbias or Vref) for the adjustable bias circuit 706. The adjustable bias circuit 706 may be implemented by an adjustable current source/sink, such as transistor M0, or by a voltage regulator with a variable reference voltage, such as voltage regulator 552.

The adjustable bias circuit 706 has an output coupled to a bias input of the oscillator 701 and may be used to adjust a bias signal (e.g., bias current $I_{VCO}$) for the oscillator, based on a control signal obtained from the control circuit. In some cases, the control circuit may receive an input signal (e.g., a feedback signal) from or based on the output of the oscillator (e.g., during a calibration) and adjust a control signal to modify the bias signal for the oscillator via the adjustable bias circuit. Using this loop, the control circuit may adjust (e.g., continually or periodically) its output control signal to achieve or maintain low bias noise contribution to oscillator phase noise (e.g., by setting $I_{VCO}$ to $I_{opt}$). In some cases, the example oscillator circuit 700 comprises a phase-locked loop or a frequency-locked loop (PLL/FLL) 702 implemented with the oscillator 701 (e.g., PLL 400 with VCO 402). In such cases, the control circuit 704 may receive an input signal (e.g., a feedback signal) from the PLL/FLL 702, such as from a loop filter (e.g., loop filter 408) of the PLL/FLL or from a replica of such a loop filter. The PLL/FLL may be a digital or an analog PLL/FLL.

In this manner, aspects of the present disclosure may utilize a loop that tracks the point of minimum sensitivity for bias noise to phase noise conversion. As noted above, this may be achieved by setting $I_{VCO}$ to $I_{opt}$, which may be determined based on the maximum frequency during a bias current sweep, or over time by setting the bias signal, determining the impact of this bias signal setting on the oscillator frequency, determining a new setting for the bias signal that drives the oscillator towards the maximum frequency, and repeating this process.

Figure 8A:
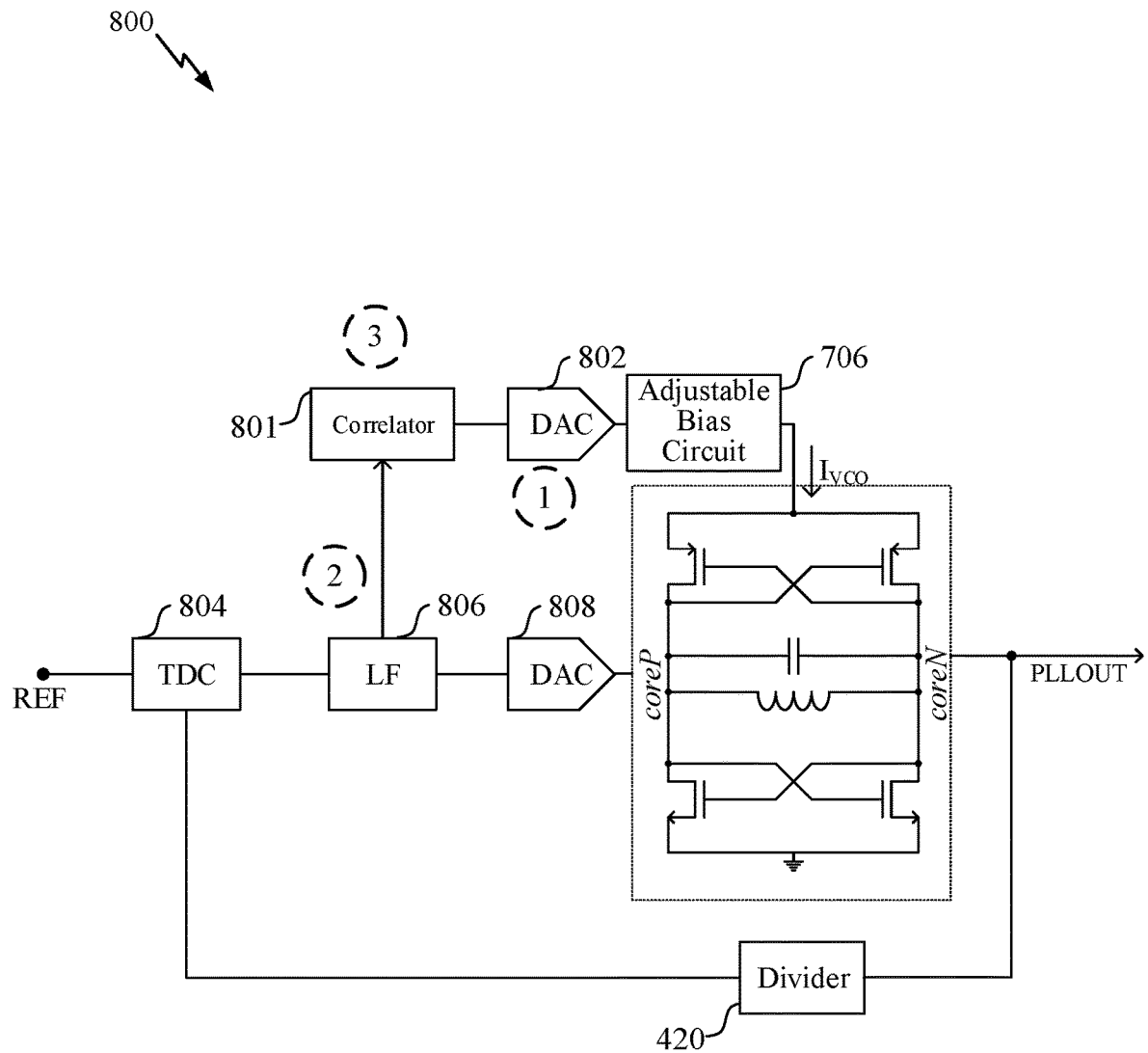
FIG. 8A is a block diagram of an example oscillator circuit with a digital phase-locked loop (PLL) or frequency-locked loop (FLL), in accordance with certain aspects of the present disclosure.

FIG. 8A depicts a block diagram of one example of an oscillator circuit 800 configured to minimize, or at least reduce, a bias noise contribution to oscillator phase noise (e.g., using the tracking loop described herein), in accordance with aspects of the present disclosure. The oscillator circuit 800 includes a digital PLL or FLL, which includes a time-to-digital converter (TDC) 804, a digital loop filter (LF) 806, a digitally controlled oscillator (DCO), and a frequency divider 420. The DCO includes a digital-to-analog converter (DAC) 808 and a voltage-controlled oscillator (VCO) (e.g., an LC oscillator, such as oscillator 701). In some cases, the TDC 804 may be replaced by a digital phase detector (e.g., a bang-bang phase detector). Although the oscillator circuit 800 is implemented as a single-ended circuit in FIG. 8A, it is to be understood that the oscillator circuit 800 may alternatively be implemented as a differential circuit.

The loop for reducing the bias noise contribution to phase noise includes logic 801, a DAC 802, and the adjustable bias circuit 706, as well as the VCO, the frequency divider 420, the TDC 804 (or digital phase detector), and the LF 806. In some cases, this loop may include a replica of the LF. The replica LF may have an input coupled to the output of the TDC (or phase detector) and have an output coupled to the logic 801. The control circuit 704 may be considered to include the logic 801, the DAC 802, and in cases with a replica LF, the replica LF. The logic 801 may be implemented as a correlator, for example, for correlating (translating) the digital LF signals to digital control signal settings.

The general operation of the tracking loop in the oscillator circuit 800 may occur in three phases, indicated by numerals (1), (2), and (3) in FIG. 8A. In a first phase (1), the bias point of the oscillator may be adjusted, for example, by changing $I_{VCO}$ using DAC 802 and the adjustable bias circuit 706. In a second phase (2), the impact of the adjustment may be detected, for example, using the frequency divider 420, the TDC 804 (or phase detector), and the LF 806 (or replica LF). For example, assuming that the oscillator increases the oscillation frequency when the controlling input (e.g., Vtune) increases, an increase in the LF output indicates the change in $I_{VCO}$ resulted in a decrease in the oscillator frequency. On the other hand, a decrease in the LF output indicates the change in $I_{VCO}$ resulted in an increase in the oscillator frequency. In a third phase (3), based on this impact detection, the logic 801 may determine a new setting for the bias point that drives the oscillator towards a maximum frequency. The logic 801 may then output a digital control signal to the DAC 802 to establish the new bias point setting.

In some cases, $I_{VCO}$ may be adjusted in relatively small increments, in order to converge at $I_{opt}$. These small adjustments may be made until $I_{VCO}$ is determined to have settled at $I_{opt}$, at which point the bias noise contribution to phase noise should be at a minimum (or near-minimum).

Figure 8B:
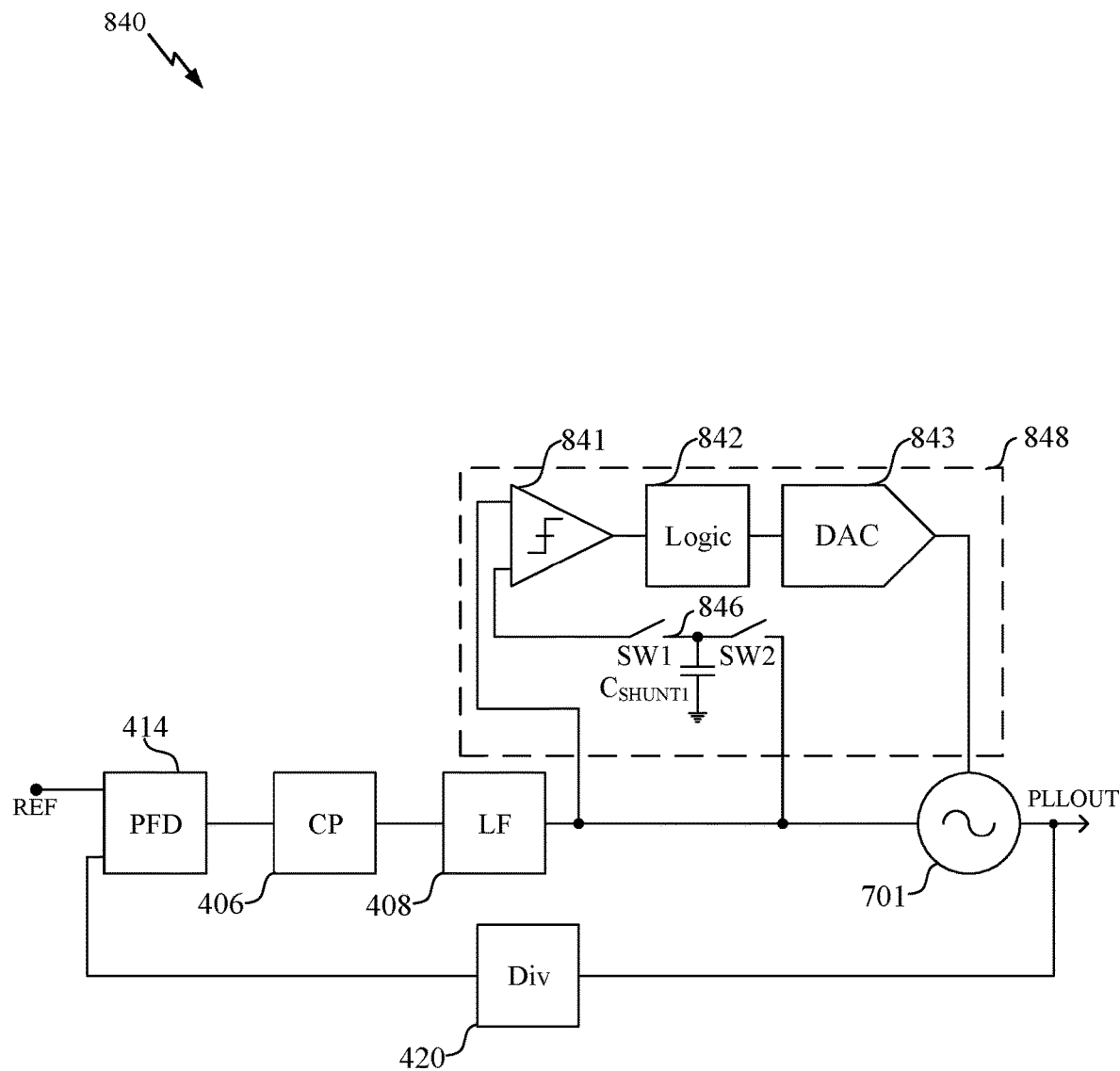
FIGS. 8B-8D are block diagrams of example oscillator circuits with an analog PLL/FLL, in accordance with certain aspects of the present disclosure.

FIG. 8B is a block diagram of an example oscillator circuit 840 with an analog PLL (or FLL) and with a control circuit 848 to control the adjustable bias circuit (not shown). The analog PLL (or FLL) may be similar to the PLL 400 of FIG. 4. The control circuit 848 may include a comparator 841, logic 842, and a DAC 843. The control circuit 848 may also include switches SW1 and SW2 and a shunt capacitive element $C_{SHUNT1}$. The comparator 841 may receive, as a first input, the output of the loop filter 408 (or the output of a replica LF). The second input of the comparator 841 may be coupled through switches SW1 and SW2 to the output of the loop filter 408. The shunt capacitive element $C_{SHUNT1}$ may be coupled between a node 846 between the switches and a reference potential node (e.g., electrical ground) of the oscillator circuit.

In order to generate a bias input control signal, the comparator 841 operates by detecting the impact of the bias circuit adjustments by comparing the current LF voltage to a previous LF voltage to detect if the LF voltage increased or decreased. Switch S2 may be closed to sample the previous LF voltage and charge the capacitive element $C_{SHUNT1}$ and may be opened to hold the sampled voltage at node 846. Switch S1 may be open during the sampling, and may be closed to apply the held voltage to the second input of the comparator 841 for the comparison with the next LF voltage. Based upon the output of the comparator 841, the logic 842 may generate a digital output for the DAC 843 to adjust the bias for the oscillator 701.

Figure 8C:
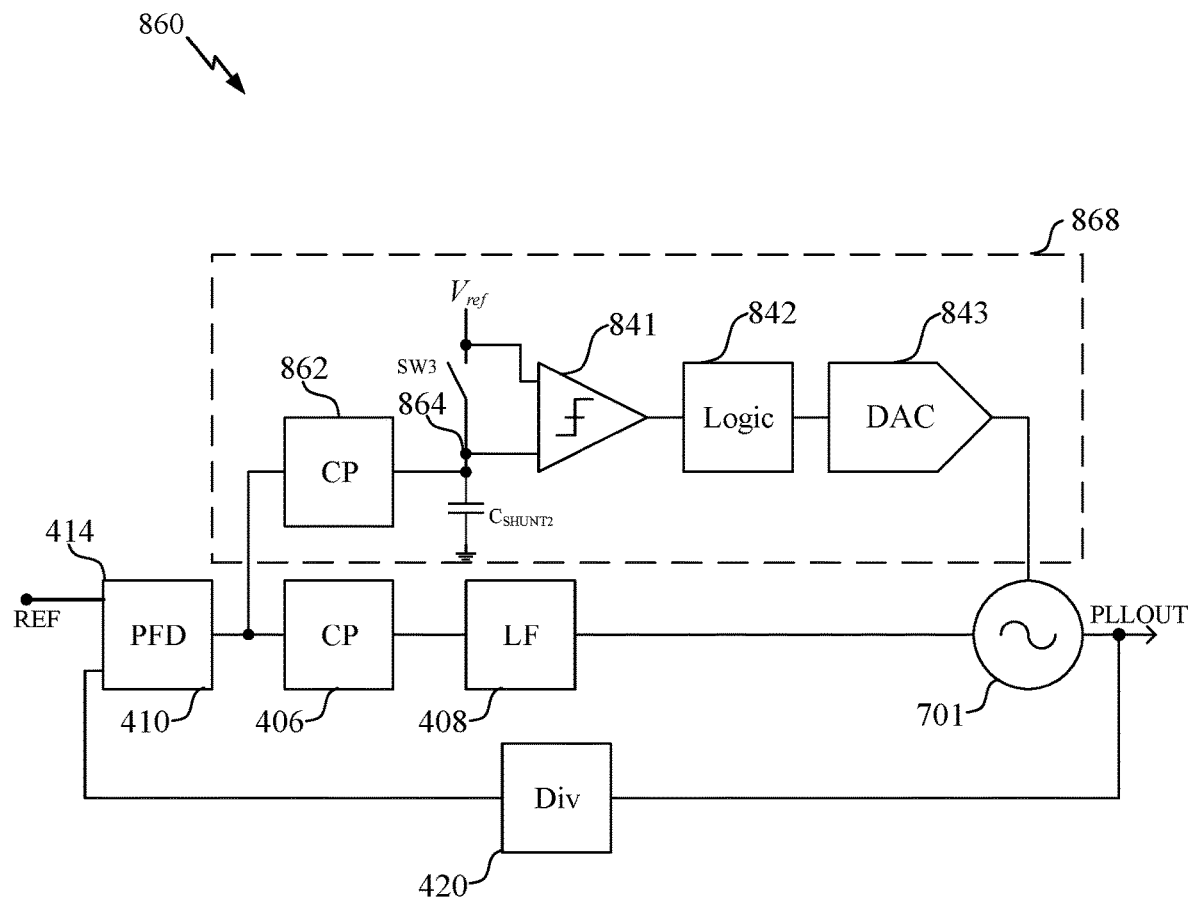

FIG. 8C is a block diagram of an example oscillator circuit 860 with an analog PLL (or FLL) and with a control circuit 868 to control the adjustable bias circuit (not shown). The control circuit 868 features a replica charge pump 862 (as distinguished from charge pump 406), the comparator 841, the logic 842, and the DAC 843. The control circuit receives, as input to the replica charge pump, the output of the PFD 414. The output of the replica charge pump may be coupled to a shunt capacitive element $C_{SHUNT2}$ coupled between node 864 and a reference potential node of the oscillator circuit 860. The comparator 841 has a first input coupled to a reference voltage node (labeled "Vref") and a second input coupled to the output of the replica charge pump (at node 864). A switch SW3 may be coupled between the first and second inputs of the comparator 841.

In order to generate a bias input control signal, the comparator 841 may detect the impact of the bias circuit adjustments by comparing the reference voltage (Vref) to the output of the replica charge pump, which charges and discharges capacitive element $C_{SHUNT2}$ in concert with the output of the charge pump 406. Based upon the output of the comparator 841, the logic 842 may change a digital output for the DAC 843 to adjust the bias for the oscillator 701. Switch S3 may be used to charge the capacitive element $C_{SHUNT2}$ to the reference voltage when closed, such that the replica charge pump may effectively increase or decrease this voltage value for the comparison.

Figure 8D:
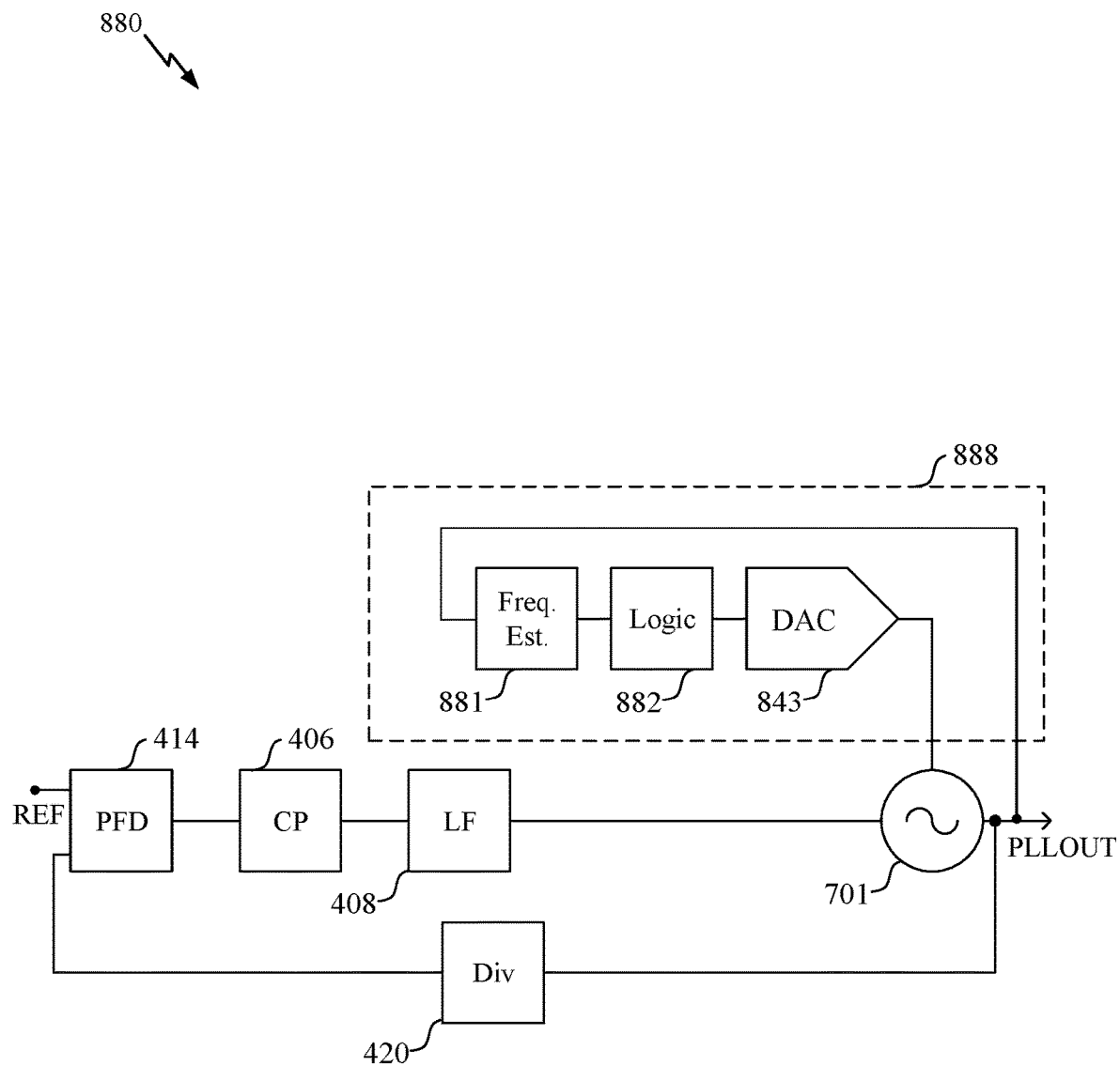

FIG. 8D is a block diagram of an example oscillator circuit 880 with an analog PLL (or FLL) and with a control circuit 888, without utilizing the input or output of the loop filter 408. Rather, the output of the oscillator 701 is coupled to the input of a frequency estimator 881 (e.g. a counter), which determines the oscillator frequency. Based on the output of the frequency estimator, logic 882 may generate a digital output for the DAC to adjust the bias for the oscillator 701. For example, the logic 882 may determine if the frequency has increased or decreased and decrease or increase the digital word for the DAC, respectively.

Example Operations for Oscillating Signal Generation

Figure 9:
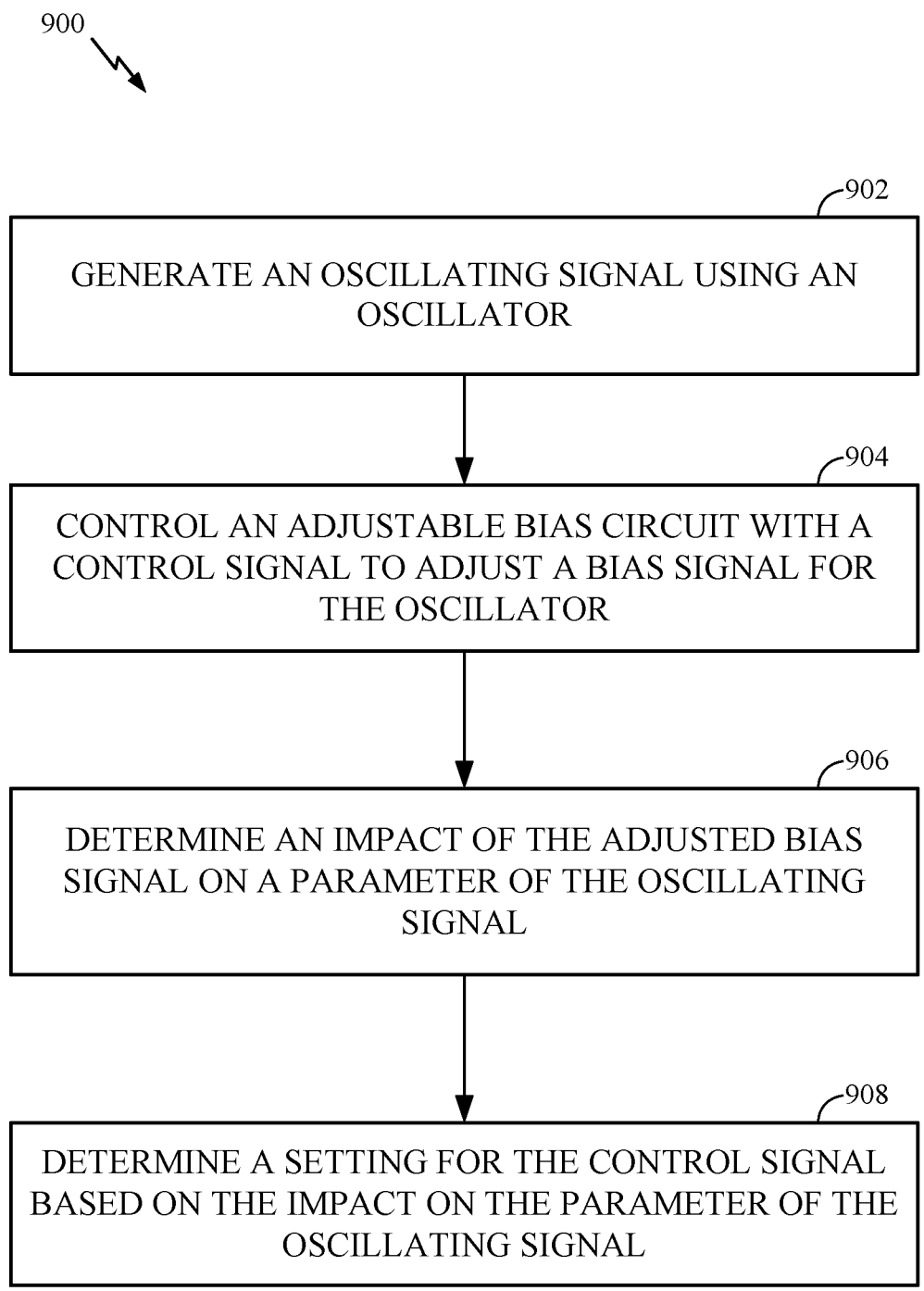
FIG. 9 is a flow diagram of example operations for generating an oscillating signal, in accordance with certain aspects of the present disclosure.

FIG. 9 is a flow diagram of example operations 900 for oscillation generation, in accordance with certain aspects of the present disclosure. The operations 900 may be performed, for example, by an oscillator circuit (e.g., the oscillator circuit 700 of FIG. 7). The operations 900 may be controlled by a controller (e.g., the controller 336 of FIG. 3) coupled to the oscillator circuit. For certain aspects, at least a portion of the oscillator circuit may be part of a frequency synthesizer (e.g., frequency synthesizers 320, 332 of FIG. 3), a phase-locked loop (PLL) (e.g., PLL 400 or PLL/FLL 702), or a frequency-locked loop (FLL) (e.g., PLL/FLL 702 of FIG. 7).

The operations 900 may begin, at block 902, with an oscillator (e.g., the oscillator 701) generating an oscillating signal. At block 904, the oscillator circuit may control an adjustable bias circuit (e.g., the adjustable bias circuit 706) with a control signal (e.g., Vbias) to adjust a bias signal (e.g., $I_{VCO}$) for the oscillator. The oscillator circuit may determine an impact of the adjusted bias signal on a parameter of the oscillating signal at block 906. At block 908, the oscillator circuit may determine a setting for the control signal based on the impact on the parameter of the oscillating signal.

According to certain aspects, the parameter is or includes a frequency of the oscillating signal. In this case, the controlling at block 904 may involve controlling the adjustable bias circuit to adjust the bias signal such that the oscillating signal achieves a maximum frequency (or a near-maximum frequency). For certain aspects, the operations 900 further include repeating controlling the adjustable bias circuit with the control signal at block 904, determining the impact of the adjusted bias signal at block 906, and determining the setting for the control signal at block 908, such that the oscillating signal achieves the maximum frequency (or the near-maximum frequency) over time (e.g., after multiple iterations of the controlling, the impact determining, and the setting determining).

According to certain aspects, the parameter is or includes a phase noise of the oscillating signal. In this case, the controlling at block 904 may include controlling the adjustable bias circuit to adjust the bias signal such that the oscillating signal achieves a minimum phase noise (or a near-minimum phase noise).

According to certain aspects, the operations 900 further involve locking a phase or a frequency of the oscillating signal (e.g., to a phase or frequency of a reference oscillating signal) using a phase- or frequency-locked loop (PLL/FLL) (e.g., PLL/FLL 702). The oscillator may be part of the PLL/FLL. In some cases, the PLL/FLL is a digital PLL/FLL, and the oscillator is a voltage-controlled oscillator (VCO) (e.g., VCO 500 or 550) or part of a digitally controlled oscillator (DCO). For certain aspects, the digital PLL/FLL includes a time-to-digital converter (TDC) (e.g., TDC 804) or a phase detector (e.g., a bang-bang phase detector), a digital filter (e.g., digital LF 806), and a first digital-to-analog converter (DAC) (e.g., DAC 808) controlling the VCO. In some cases, determining the impact at block 906 may involve using a replica filter (not shown) that replicates the digital filter and filters an output signal from the TDC or the phase detector, determining the setting at block 908 may be performed by logic (e.g., logic 801) receiving a filtered signal from the replica filter, and/or controlling the adjustable bias circuit at block 904 may include using a second DAC (e.g., DAC 802) that receives the setting from the logic and generates the control signal. In other cases, determining the impact at block 906 may involve using the digital filter itself to filter an output signal from the TDC or the phase detector, and determining the setting at block 908 may be performed by logic (e.g., logic 801) receiving a filtered signal from the digital filter.

Figure 10:
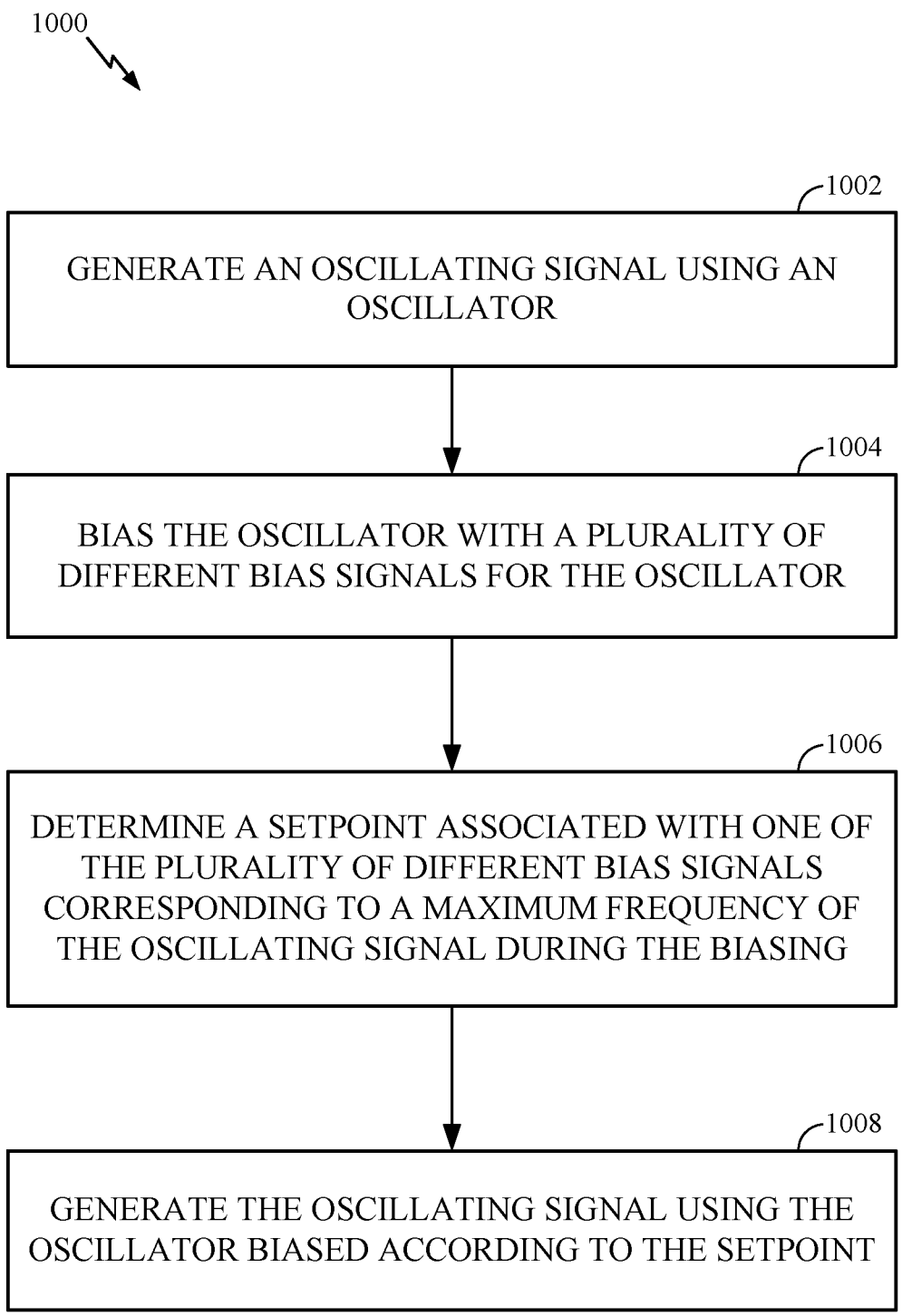
FIG. 10 is a flow diagram of example operations for generating an oscillating signal, in accordance with certain aspects of the present disclosure.

FIG. 10 is a flow diagram of example operations 1000 for oscillation generation, in accordance with certain aspects of the present disclosure. The operations 1000 may be performed, for example, by an oscillator circuit (e.g., the oscillator circuit 700 of FIG. 7). The operations 1000 may be controlled by a controller (e.g., the controller 336 of FIG. 3) coupled to the oscillator circuit. For certain aspects, at least a portion of the oscillator circuit may be part of a frequency synthesizer (e.g., frequency synthesizers 320, 332 of FIG. 3) or a phase- or frequency-locked loop (e.g., PLL/FLL 702 of FIG. 7).

The operations 1000 may begin, at block 1002, with an oscillator (e.g., the oscillator 701) generating an oscillating signal. The oscillator circuit may bias the oscillator with a plurality of different bias signals for the oscillator at block 1004. At block 1006, the oscillator circuit may determine a setpoint associated with one of the plurality of different bias signals corresponding to a maximum frequency (or a near-maximum frequency) of the oscillating signal during the biasing. At block 1008, the oscillating signal may be generated using the oscillator biased according to the setpoint.

According to certain aspects, the operations 1000 may further involve controlling an adjustable bias circuit (e.g., adjustable bias circuit 706) with a control signal (e.g., Vbias) to adjust a bias signal (e.g., $I_{VCO}$) for the oscillator. In this case, the setpoint may be a setting of the control signal. For example, the setpoint may be a digital word (e.g., stored in memory), representing a value of the control signal. For certain aspects, the operations 1000 may further include locking a phase or a frequency of the oscillating signal (e.g., to a phase or frequency of a reference oscillating signal) using a phase- or frequency-locked loop (PLL/FLL) (e.g., PLL/FLL 702). In this case, the oscillator may be part of the PLL/FLL. In some cases, the PLL/FLL is a digital PLL/FLL, and the oscillator is a voltage-controlled oscillator (VCO). For certain aspects, the digital PLL/FLL includes a time-to-digital converter (TDC) (e.g., TDC 804) or a phase detector (e.g., a bang-bang phase detector), a digital filter (e.g., digital LF 806), and a first digital-to-analog converter (DAC) (e.g., DAC 808) controlling the VCO. In some cases, determining the setpoint is performed by logic (e.g., logic 801) receiving a filtered signal from the digital filter or from a replica of the digital filter. Controlling the adjustable bias circuit may involve using a second DAC (e.g., DAC 802) that receives the setpoint from the logic and generates the control signal.

EXAMPLE ASPECTS

In addition to the various aspects described above, specific combinations of aspects are within the scope of the disclosure, some of which are detailed below:

Aspect 1: An oscillator circuit comprising: an oscillator configured to generate an oscillating signal; an adjustable bias circuit coupled to a bias input of the oscillator and configured to provide a bias signal to the oscillator; and a control circuit including an input coupled to an output of the oscillator and including an output coupled to a control input of the adjustable bias circuit, the control circuit being configured to control the adjustable bias circuit to adjust the bias signal with a control signal, to determine an impact of the adjusted bias signal on a parameter of the oscillating signal, and to determine a setting for the control signal based on the impact on the parameter of the oscillating signal.

Aspect 2: The oscillator circuit of Aspect 1, wherein the parameter comprises a frequency of the oscillating signal and wherein the control circuit is configured to control the adjustable bias circuit to adjust the bias signal such that the oscillating signal achieves a maximum frequency.

Aspect 3: The oscillator circuit of Aspect 2, wherein the control circuit is configured to control the adjustable bias circuit to adjust the bias signal such that the oscillating signal achieves the maximum frequency over time, through multiple iterations of controlling the adjustable bias circuit with the control signal, determining the impact of the adjusted bias signal, and determining the setting for the control signal.

Aspect 4: The oscillator circuit of Aspect 1, wherein the parameter comprises a phase noise of the oscillating signal and wherein the control circuit is configured to control the adjustable bias circuit to adjust the bias signal such that the oscillating signal achieves a minimum phase noise.

Aspect 5: The oscillator circuit of any preceding Aspect, further comprising a phase- or frequency-locked loop (PLL/FLL), wherein the oscillator is part of the PLL/FLL and wherein the input of the control circuit is coupled to the PLL/FLL.

Aspect 6. The oscillator circuit of Aspect 5, wherein: the PLL/FLL is a digital PLL/FLL; the oscillator comprises a voltage-controlled oscillator (VCO); the digital PLL/FLL comprises a time-to-digital converter (TDC) or a phase detector, a digital filter including an input coupled to an output of the TDC or the phase detector, and a first digital-to-analog converter (DAC) including an input coupled to an output of the digital filter and including an output coupled to a control input of the VCO; and an output of the VCO is coupled to an input of the TDC or the phase detector.

Aspect 7: The oscillator circuit of Aspect 6, wherein the digital PLL/FLL further comprises a frequency divider including an input coupled to the output of the VCO and including an output coupled to the input of the TDC or the phase detector.

Aspect 8: The oscillator circuit of Aspect 6 or 7, wherein the control circuit comprises: logic including an input coupled to the output of the digital filter; and a second DAC including an input coupled to an output of the logic and including an output coupled to the bias input of the oscillator.

Aspect 9: The oscillator circuit of Aspect 6 or 7, wherein the control circuit comprises: a replica filter including an input coupled to the output of the TDC or the phase detector; logic including an input coupled to an output of the replica filter; and a second DAC including an input coupled to an output of the logic and including an output coupled to the bias input of the oscillator.

Aspect 10: The oscillator circuit of Aspect 5, wherein: the PLL/FLL is an analog PLL/FLL; the oscillator comprises a voltage-controlled oscillator (VCO); the analog PLL/FLL comprises a phase-frequency detector (PFD), a charge pump including an input coupled to an output of the PFD, and a filter including an input coupled to an output of the charge pump and including an output coupled to a control input of the VCO; and an output of the VCO is coupled to an input of the PFD.

Aspect 11: The oscillator circuit of Aspect 10, wherein the control circuit comprises: a replica charge pump including an input coupled to the output of the PFD; a shunt capacitive element coupled to an output of the replica charge pump; a comparator including a first input coupled to the output of the replica charge pump and including a second input coupled to a reference voltage node; a switch coupled between the first input and the second input of the comparator; logic including an input coupled to an output of the comparator; and a digital-to-analog converter including an input coupled to an output of the logic and including an output coupled to the bias input of the oscillator.

Aspect 12: The oscillator circuit of Aspect 10, wherein the control circuit comprises: a comparator including a first input coupled to the output of the filter; a shunt capacitive element coupled between a node and a reference potential node of the oscillator circuit; a first switch coupled between a second input of the comparator and the node; a second switch coupled between the node and the output of the filter; logic including an input coupled to an output of the comparator; and a digital-to-analog converter including an input coupled to an output of the logic and including an output coupled to the bias input of the oscillator.

Aspect 13: The oscillator circuit of Aspect 10, wherein the control circuit comprises: a counter including an input coupled to the output of the VCO; logic including an input coupled to an output of the counter; and a digital-to-analog converter including an input coupled to an output of the logic and including an output coupled to the bias input of the oscillator.

Aspect 14: The oscillator circuit of any of Aspects 10 to 13, wherein the analog PLL/FLL further comprises a frequency divider including an input coupled to the output of the VCO and including an output coupled to the input of the PFD.

Aspect 15: The oscillator circuit of any of the preceding Aspects, wherein the oscillator comprises a resonant circuit and at least one cross-coupled pair of transistors coupled to the resonant circuit.

Aspect 16: The oscillator circuit of Aspect 15, wherein: the resonant circuit comprises an inductive element coupled between a positive output and a negative output of the oscillator and coupled in parallel with a capacitive element; and the at least one cross-coupled pair of transistors comprises: a first transistor including a drain coupled to the positive output and including a gate coupled to the negative output of the oscillator; and a second transistor including a drain coupled to the negative output and including a gate coupled to the positive output of the oscillator.

Aspect 17: The oscillator circuit of Aspect 15 or 16, wherein the adjustable bias circuit comprises a tail current source configured to source or sink a bias current to or from the at least one cross-coupled pair of transistors.

Aspect 18: A method of oscillation generation, comprising: generating an oscillating signal using an oscillator; controlling an adjustable bias circuit with a control signal to adjust a bias signal for the oscillator; determining an impact of the adjusted bias signal on a parameter of the oscillating signal; and determining a setting for the control signal based on the impact on the parameter of the oscillating signal.

Aspect 19: The method of Aspect 18, wherein the parameter comprises a frequency of the oscillating signal and wherein the controlling comprises controlling the adjustable bias circuit to adjust the bias signal such that the oscillating signal achieves a maximum frequency.

Aspect 20: The method of Aspect 19, further comprising repeating controlling the adjustable bias circuit with the control signal, determining the impact of the adjusted bias signal, and determining the setting for the control signal, such that the oscillating signal achieves the maximum frequency over time.

Aspect 21: The method of Aspect 18, wherein the parameter comprises a phase noise of the oscillating signal and wherein the controlling comprises controlling the adjustable bias circuit to adjust the bias signal such that the oscillating signal achieves a minimum phase noise.

Aspect 22: The method of any of Aspects 18 to 21, further comprising locking a phase or a frequency of the oscillating signal using a phase- or frequency-locked loop (PLL/FLL), wherein the oscillator is part of the PLL/FLL.

Aspect 23: The method of claim 22, wherein: the PLL/FLL is a digital PLL/FLL; the oscillator comprises a voltage-controlled oscillator (VCO); the digital PLL/FLL comprises a time-to-digital converter (TDC) or a phase detector, a digital filter, and a first digital-to-analog converter (DAC) controlling the VCO; determining the impact comprises using a replica filter that replicates the digital filter and filters an output signal from the TDC or the phase detector; determining the setting is performed by logic receiving a filtered signal from the replica filter; and controlling the adjustable bias circuit comprises using a second DAC that receives the setting from the logic and generates the control signal.

Aspect 24: The method of Aspect 22, wherein: the PLL/FLL is a digital PLL/FLL; the oscillator comprises a voltage-controlled oscillator (VCO); the digital PLL/FLL comprises a time-to-digital converter (TDC) or a phase detector, a digital filter, and a first digital-to-analog converter (DAC) controlling the VCO; determining the impact comprises using the digital filter to filter an output signal from the TDC or the phase detector; determining the setting is performed by logic receiving a filtered signal from the digital filter; and controlling the adjustable bias circuit comprises using a second DAC that receives the setting from the logic and generates the control signal.

Aspect 25: An apparatus comprising: means for generating an oscillating signal; means for providing an adjustable bias signal to bias the means for generating the oscillating signal; and means for controlling the means for providing the adjustable bias signal with a control signal, wherein the means for controlling is configured to: determine an impact of the adjusted bias signal on a parameter of the oscillating signal; and determine a setting for the control signal based on the impact on the parameter of the oscillating signal.

Aspect 26: A method of oscillation generation, comprising: generating an oscillating signal using an oscillator; biasing the oscillator with a plurality of different bias signals for the oscillator; determining a setpoint associated with one of the plurality of different bias signals corresponding to a maximum frequency of the oscillating signal during the biasing; and generating the oscillating signal using the oscillator biased according to the setpoint.

Aspect 27: The method of Aspect 26, further comprising controlling an adjustable bias circuit with a control signal to adjust a bias signal for the oscillator, wherein the setpoint comprises a setting of the control signal.

Aspect 28: The method of Aspect 26 or 27, further comprising locking a phase or a frequency of the oscillating signal using a phase- or frequency-locked loop (PLL/FLL), wherein the oscillator is part of the PLL/FLL.

Aspect 29: The method of Aspect 28, wherein: the PLL/FLL is a digital PLL/FLL; the oscillator comprises a voltage-controlled oscillator (VCO); the digital PLL/FLL comprises a time-to-digital converter (TDC) or a phase detector, a digital filter, and a first digital-to-analog converter (DAC) controlling the VCO; determining the setpoint is performed by logic receiving a filtered signal from the digital filter or from a replica of the digital filter; and controlling the adjustable bias circuit comprises using a second DAC that receives the setpoint from the logic and generates the control signal.

Additional Considerations

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering. For example, means for generating an oscillating signal may include an oscillator, such as the oscillator 701 depicted in FIG. 7. Means for providing an adjustable bias signal may include an adjustable bias circuit, such as the adjustable bias circuit 706 portrayed in FIG. 7. Means for controlling may include a control circuit or logic, such as the control circuit 704 illustrated in FIG. 7, the logic 801 shown in FIG. 8A, the control circuit 848 depicted in FIG. 8B, the control circuit 868 illustrated in FIG. 8C, or the control circuit 888 shown in FIG. 8D.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An oscillator circuit comprising:
an oscillator configured to generate an oscillating signal;
an adjustable bias circuit coupled to a bias input of the oscillator and configured to provide a bias signal to the oscillator;
a control circuit including an input coupled to an output of the oscillator and including an output coupled to a control input of the adjustable bias circuit, the control circuit being configured to control the adjustable bias circuit to adjust the bias signal with a control signal, to determine an impact of the adjusted bias signal on a parameter of the oscillating signal, and to determine a setting for the control signal based on the impact on the parameter of the oscillating signal; and
an analog phase- or frequency-locked loop (PLL/FLL), wherein:
the oscillator is part of the analog PLL/FLL;
the input of the control circuit is coupled to the analog PLL/FLL;
the oscillator comprises a voltage-controlled oscillator (VCO);
the analog PLL/FLL comprises a phase-frequency detector (PFD), a charge pump including an input coupled to an output of the PFD, and a filter including an input coupled to an output of the charge pump and including an output coupled to a control input of the VCO;
an output of the VCO is coupled to an input of the PFD; and
the control circuit comprises:
a replica charge pump including an input coupled to the output of the PFD;

a shunt capacitive element coupled to an output of the replica charge pump;
a comparator including a first input coupled to the output of the replica charge pump and including a second input coupled to a reference voltage node;
a switch coupled between the first input and the second input of the comparator;
logic including an input coupled to an output of the comparator; and
a digital-to-analog converter including an input coupled to an output of the logic and an output coupled to the bias input of the oscillator.

2. The oscillator circuit of claim 1, wherein the parameter comprises a frequency of the oscillating signal and wherein the control circuit is configured to control the adjustable bias circuit to adjust the bias signal such that the oscillating signal achieves a maximum frequency.

3. The oscillator circuit of claim 2, wherein the control circuit is configured to control the adjustable bias circuit to adjust the bias signal such that the oscillating signal achieves the maximum frequency over time, through multiple iterations of controlling the adjustable bias circuit with the control signal, determining the impact of the adjusted bias signal, and determining the setting for the control signal.

4. The oscillator circuit of claim 1, wherein the parameter comprises a phase noise of the oscillating signal and wherein the control circuit is configured to control the adjustable bias circuit to adjust the bias signal such that the oscillating signal achieves a minimum phase noise.

5. An oscillator circuit comprising:
an oscillator configured to generate an oscillating signal;
an adjustable bias circuit coupled to a bias input of the oscillator and configured to provide a bias signal to the oscillator;
a control circuit including an input coupled to an output of the oscillator and including an output coupled to a control input of the adjustable bias circuit, the control circuit being configured to control the adjustable bias circuit to adjust the bias signal with a control signal, to determine an impact of the adjusted bias signal on a parameter of the oscillating signal, and to determine a setting for the control signal based on the impact on the parameter of the oscillating signal; and
a digital phase- or frequency-locked loop (PLL/FLL), wherein:
the oscillator is part of the digital PLL/FLL;
the input of the control circuit is coupled to the digital PLL/FLL;
the oscillator comprises a voltage-controlled oscillator (VCO);
the digital PLL/FLL comprises a time-to-digital converter (TDC) or a phase detector, a digital filter including an input coupled to an output of the TDC or the phase detector, and a first digital-to-analog converter (DAC) including an input coupled to an output of the digital filter and including an output coupled to a control input of the VCO; and
an output of the VCO is coupled to an input of the TDC or the phase detector.

6. The oscillator circuit of claim 5, wherein the digital PLL/FLL further comprises a frequency divider including an input coupled to the output of the VCO and including an output coupled to the input of the TDC or the phase detector.

7. The oscillator circuit of claim 5, wherein the control circuit comprises:

logic including an input coupled to the output of the digital filter; and
a second DAC including an input coupled to an output of the logic and including an output coupled to the bias input of the oscillator.

8. The oscillator circuit of claim 5, wherein the control circuit comprises:
a replica filter including an input coupled to the output of the TDC or the phase detector;
logic including an input coupled to an output of the replica filter; and
a second DAC including an input coupled to an output of the logic and including an output coupled to the bias input of the oscillator.

9. An oscillator circuit comprising:
an oscillator configured to generate an oscillating signal;
an adjustable bias circuit coupled to a bias input of the oscillator and configured to provide a bias signal to the oscillator;
a control circuit including an input coupled to an output of the oscillator and including an output coupled to a control input of the adjustable bias circuit, the control circuit being configured to control the adjustable bias circuit to adjust the bias signal with a control signal, to determine an impact of the adjusted bias signal on a parameter of the oscillating signal, and to determine a setting for the control signal based on the impact on the parameter of the oscillating signal; and
an analog phase- or frequency-locked loop (PLL/FLL), wherein:
the oscillator is part of the analog PLL/FLL;
the input of the control circuit is coupled to the analog PLL/FLL;
the oscillator comprises a voltage-controlled oscillator (VCO);
the analog PLL/FLL comprises a phase-frequency detector (PFD), a charge pump including an input coupled to an output of the PFD, and a filter including an input coupled to an output of the charge pump and including an output coupled to a control input of the VCO;
an output of the VCO is coupled to an input of the PFD; and
the control circuit comprises:
a comparator including a first input coupled to the output of the filter;
a shunt capacitive element coupled between a node and a reference potential node of the oscillator circuit;
a first switch coupled between a second input of the comparator and the node;
a second switch coupled between the node and the output of the filter;
logic including an input coupled to an output of the comparator; and
a digital-to-analog converter including an input coupled to an output of the logic and an output coupled to the bias input of the oscillator.

10. An oscillator circuit comprising:
an oscillator configured to generate an oscillating signal;
an adjustable bias circuit coupled to a bias input of the oscillator and configured to provide a bias signal to the oscillator;
a control circuit including an input coupled to an output of the oscillator and including an output coupled to a control input of the adjustable bias circuit, the control circuit being configured to control the adjustable bias circuit to adjust the bias signal with a control signal, to determine an impact of the adjusted bias signal on a parameter of the oscillating signal, and to determine a setting for the control signal based on the impact on the parameter of the oscillating signal; and an analog phase- or frequency-locked loop (PLL/FLL), wherein:
the oscillator is part of the analog PLL/FLL;
the input of the control circuit is coupled to the analog PLL/FLL;
the oscillator comprises a voltage-controlled oscillator (VCO);
the analog PLL/FLL comprises a phase-frequency detector (PFD), a charge pump including an input coupled to an output of the PFD, and a filter including an input coupled to an output of the charge pump and including an output coupled to a control input of the VCO;
an output of the VCO is coupled to an input of the PFD; and
the control circuit comprises:
a counter including an input coupled to the output of the VCO;
logic including an input coupled to an output of the counter; and
a digital-to-analog converter including an input coupled to an output of the logic and an output coupled to the bias input of the oscillator.

11. The oscillator circuit of claim 1, wherein the analog PLL/FLL further comprises a frequency divider including an input coupled to the output of the VCO and including an output coupled to the input of the PFD.

12. The oscillator circuit of claim 1, wherein the oscillator comprises:
a resonant circuit; and
at least one cross-coupled pair of transistors coupled to the resonant circuit.

13. The oscillator circuit of claim 12, wherein:
the resonant circuit comprises an inductive element coupled between a positive output and a negative output of the oscillator and coupled in parallel with a capacitive element; and
the at least one cross-coupled pair of transistors comprises:
a first transistor including a drain coupled to the positive output and including a gate coupled to the negative output of the oscillator; and
a second transistor including a drain coupled to the negative output and including a gate coupled to the positive output of the oscillator.

14. The oscillator circuit of claim 12, wherein the adjustable bias circuit comprises a tail current source configured to source or sink a bias current to or from the at least one cross-coupled pair of transistors.

15. A method of oscillation generation, comprising:
generating an oscillating signal using an oscillator;
controlling an adjustable bias circuit with a control signal to adjust a bias signal for the oscillator;
determining an impact of the adjusted bias signal on a parameter of the oscillating signal;
determining a setting for the control signal based on the impact on the parameter of the oscillating signal, wherein controlling the adjustable bias circuit comprises using a first digital-to-analog converter (DAC) that receives the setting from logic and generates the control signal; and locking a phase or a frequency of the oscillating signal using a phase- or frequency-locked loop (PLL/FLL), wherein:
the oscillator is part of the PLL/FLL;
the PLL/FLL is a digital PLL/FLL;
the oscillator comprises a voltage-controlled oscillator (VCO);
the digital PLL/FLL comprises a time-to-digital converter (TDC) or a phase detector, a digital filter, and a second DAC controlling the VCO;
determining the impact comprises:
using a replica filter that replicates the digital filter and filters an output signal from the TDC or the phase detector; or
using the digital filter to filter the output signal from the TDC or the phase detector; and
determining the setting is performed by the logic receiving a filtered signal from the replica filter or from the digital filter.

16. The method of claim 15, wherein the parameter comprises a frequency of the oscillating signal and wherein the controlling comprises controlling the adjustable bias circuit to adjust the bias signal such that the oscillating signal achieves a maximum frequency.

17. The method of claim 16, further comprising repeating controlling the adjustable bias circuit with the control signal, determining the impact of the adjusted bias signal, and determining the setting for the control signal, such that the oscillating signal achieves the maximum frequency over time.

18. The method of claim 15, wherein the parameter comprises a phase noise of the oscillating signal and wherein the controlling comprises controlling the adjustable bias circuit to adjust the bias signal such that the oscillating signal achieves a minimum phase noise.

19. A method of oscillation generation, comprising:
generating an oscillating signal using an oscillator;
biasing the oscillator with a plurality of different bias signals for the oscillator;
determining a setpoint associated with one of the plurality of different bias signals corresponding to a maximum frequency of the oscillating signal during the biasing;
generating the oscillating signal using the oscillator biased according to the setpoint;
controlling an adjustable bias circuit with a control signal to adjust a bias signal for the oscillator, wherein the setpoint comprises a setting of the control signal; and
locking a phase or a frequency of the oscillating signal using a digital phase- or frequency-locked loop (PLL/FLL), wherein:
the oscillator is part of the digital PLL/FLL;
the oscillator comprises a voltage-controlled oscillator (VCO);
the digital PLL/FLL comprises a time-to-digital converter (TDC) or a phase detector, a digital filter, and a first digital-to-analog converter (DAC) controlling the VCO;
determining the setpoint is performed by logic receiving a filtered signal from the digital filter or from a replica of the digital filter; and
controlling the adjustable bias circuit comprises using a second DAC that receives the setpoint from the logic and generates the control signal.

20. The oscillator circuit of claim 9, wherein the parameter comprises a frequency of the oscillating signal and wherein the control circuit is configured to control the adjustable bias circuit to adjust the bias signal such that the oscillating signal achieves a maximum frequency.

21. The oscillator circuit of claim 20, wherein the control circuit is configured to control the adjustable bias circuit to adjust the bias signal such that the oscillating signal achieves the maximum frequency over time, through multiple iterations of controlling the adjustable bias circuit with the control signal, determining the impact of the adjusted bias signal, and determining the setting for the control signal.

22. The oscillator circuit of claim 9, wherein the parameter comprises a phase noise of the oscillating signal and wherein the control circuit is configured to control the adjustable bias circuit to adjust the bias signal such that the oscillating signal achieves a minimum phase noise.

23. The oscillator circuit of claim 10, wherein the parameter comprises a frequency of the oscillating signal and wherein the control circuit is configured to control the adjustable bias circuit to adjust the bias signal such that the oscillating signal achieves a maximum frequency.

24. The oscillator circuit of claim 23, wherein the control circuit is configured to control the adjustable bias circuit to adjust the bias signal such that the oscillating signal achieves the maximum frequency over time, through multiple iterations of controlling the adjustable bias circuit with the control signal, determining the impact of the adjusted bias signal, and determining the setting for the control signal.

25. The oscillator circuit of claim 10, wherein the parameter comprises a phase noise of the oscillating signal and wherein the control circuit is configured to control the adjustable bias circuit to adjust the bias signal such that the oscillating signal achieves a minimum phase noise.

* * * * *